United States Patent
Fujita et al.

(10) Patent No.: US 7,148,135 B2
(45) Date of Patent: Dec. 12, 2006

(54) METHOD OF DESIGNING LOW-POWER SEMICONDUCTOR INTEGRATED CIRCUIT

(75) Inventors: Mitsutoshi Fujita, Osaka (JP); Shuji Kondo, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/815,690

(22) Filed: Apr. 2, 2004

(65) Prior Publication Data
US 2004/0216069 A1 Oct. 28, 2004

(30) Foreign Application Priority Data
Apr. 25, 2003 (JP) .............................. 2003-122717

(51) Int. Cl.
*H01L 21/44* (2006.01)
(52) U.S. Cl. .............................. 438/599; 257/E21.522; 736/9
(58) Field of Classification Search ................ 438/599; 257/E21.522, E21.526; 716/9, 10, 11
See application file for complete search history.

(56) References Cited

U.S. PATENT DOCUMENTS

| | | | | |
|---|---|---|---|---|
| 5,687,088 A | * | 11/1997 | Tomita | ........................ 703/15 |
| 6,202,193 B1 | | 3/2001 | Emura et al. | |
| 6,507,939 B1 | * | 1/2003 | Andreev et al. | ............... 716/10 |
| 6,886,152 B1 | * | 4/2005 | Kong | ........................... 716/16 |
| 2004/0003363 A1 | * | 1/2004 | Odilavadze et al. | ........... 716/8 |

FOREIGN PATENT DOCUMENTS

| JP | 5-205006 | 8/1993 |
|---|---|---|
| JP | 7-58206 | 3/1995 |
| JP | 11-330252 | 11/1999 |

* cited by examiner

*Primary Examiner*—Caridad Everhart
(74) *Attorney, Agent, or Firm*—McDermott Will & Emery LLP

(57) ABSTRACT

A branching point on a wire is detected in the layout results S101. A delay amount of a route with a dummy buffer being inserted on a wire subsequent to the branching point S102 and that of the route without a dummy buffer being inserted are then calculated S103. Based on the delay amounts, an insertion point at which a load-dividing buffer is to be inserted is determined S104. On condition that a load-dividing buffer is to be inserted at the insertion point, the drive capability of a driving cell preceding the insertion point is calculated so that timing constraints are satisfied S105. Then, after it is confirmed that a load-dividing buffer is insertable at the determined insertion point S106, processes of placing a load-dividing buffer, changing the drive capability of the driving cell, and changing wiring information are performed on the layout results S107.

9 Claims, 18 Drawing Sheets

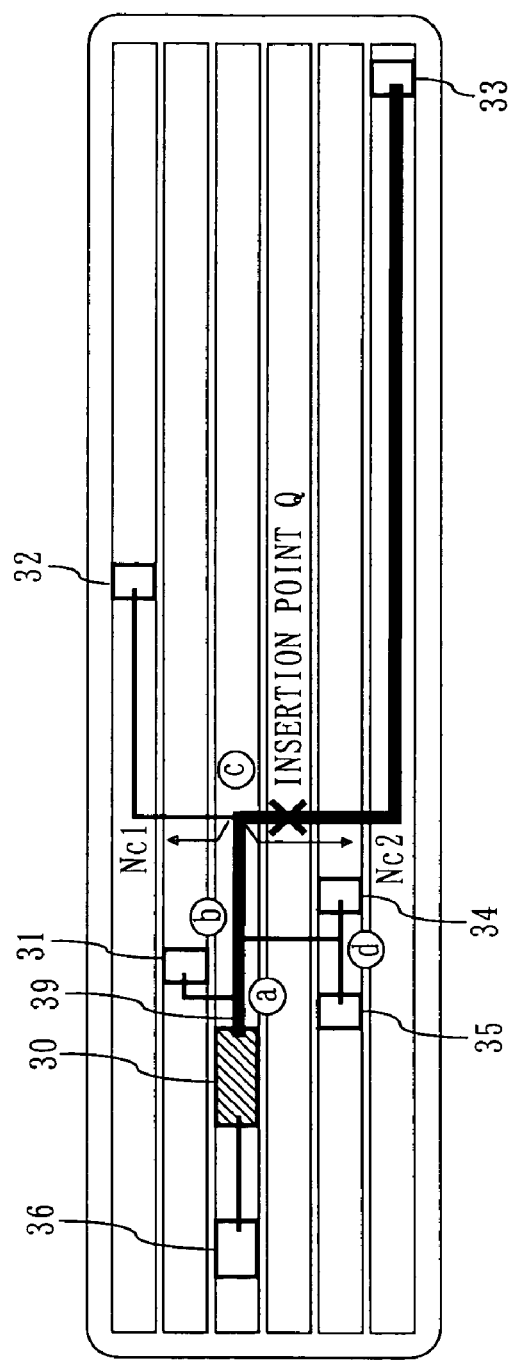
F I G. 8A
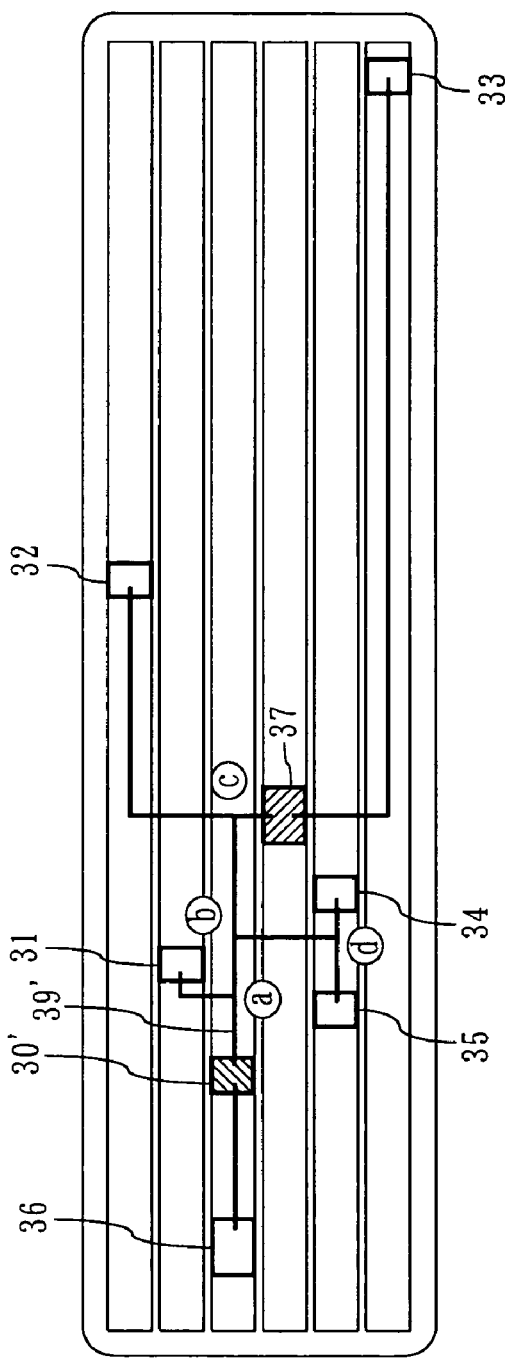
F I G. 8B

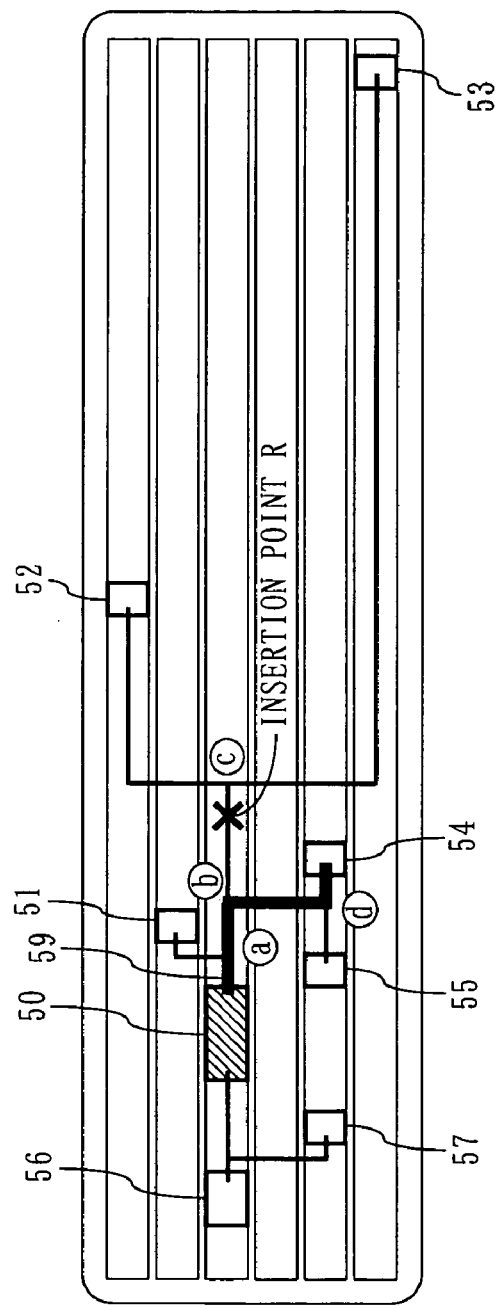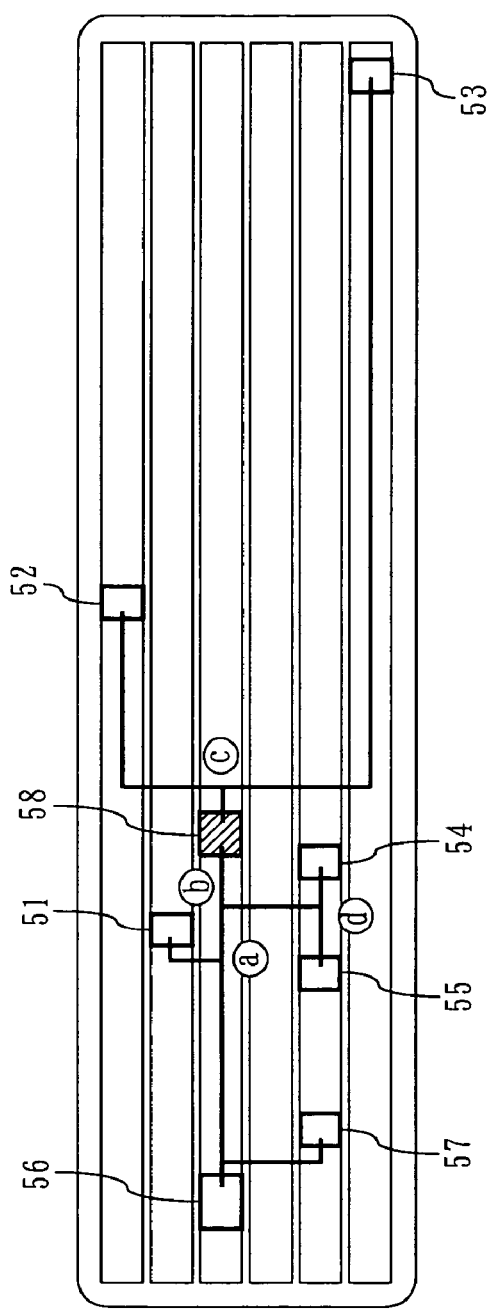
FIG. 17A
FIG. 17B

METHOD OF DESIGNING LOW-POWER SEMICONDUCTOR INTEGRATED CIRCUIT

BACKGROUND OF THE INVENTION

1. Field of the Invention

The present invention relates to methods of designing low-power semiconductor integrated circuits. More specifically, the present invention relates to a method of designing a low-power semiconductor integrated circuit by changing the circuit layout results obtained through a top-down design methodology.

2. Description of the Background Art

In recent years, most logic LSIs are designed by using a top-down design methodology. The top-down design methodology typically includes a function design process, a logic synthesis process, and an automatic layout process. In the function design process, the designer uses a Hardware Description Language (HDL) to functionally describe a circuit to be designed. In the logic synthesis process, the functionally-described circuit is converted to circuit data at the gate level. In the automatic layout process, the designer uses an automatic layout tool to obtain layout results (results obtained by arranging cells included in the circuit, wiring between cells, etc.) based on the circuit data at the gate level. The obtained layout results are subjected to a timing verification process, a layout verification process, and other verification processes. By using the layout results after these verification processes, the actual device is manufactured.

Recently, an improvement in circuit integration level and an increase in circuit operation frequency have increased the complexity of the circuit design. Accordingly, it is extremely difficult to quickly complete the processes from the logic synthesis process to the automatic layout process. For this reason, there have been developed a large number of design tools, including a logic synthesis tool and an automatic layout tool, with the principle emphasis on quick completion of the processes rather than on the optimization of the circuit size or the chip size. In such design tools, quickly achieving timings indispensable for the operation of the circuit is highly valued. Therefore, circuits tend to have a large design margin. Such circuits with a large design margin, however, require a large amount of power consumption during operation. In order to reduce the power consumption of the circuit, therefore, reducing an excessive design margin at the circuit designing stage is crucial.

Examples of a scheme of reducing an excessive design margin from the circuit designed by using a top-down design methodology are a scheme of calculating the power consumption by using a circuit simulator and selecting an optimum cell (by using a device disclosed in Japanese Patent Laid-Open Publication No. 5-205006 (1993-205006), for example), a scheme of detecting a changeable cell in a circuit (refer to Japanese Patent Laid-Open Publication No. 11-330252(1999-330252), for example), and a scheme of designing a circuit with a limited function by using a design methodology specifically tailored to low power consumption.

FIG. 19 is a process chart of a low-power design scheme using a circuit simulator. The method illustrated in FIG. 19 includes a series of processes including a function design process S901, a logic synthesis process S902, an automatic layout process S903, a timing verification process S904, a layout verification process S907, and a device manufacturing process S908, together with a power consumption simulation process S905 and a circuit modification process S906. In the power consumption simulation process S905, power consumption of a circuit is calculated by using a circuit simulator based on layout results subjected to timing verification. If the calculated power consumption of the circuit exceeds a desired value, the circuit is modified in the circuit modification process S906. Then, in accordance with the degree of modification, the processes starting from the logic synthesis process S902, the automatic layout process S903, or the timing verification process S904 are performed again.

However, the above conventional low-power design schemes have the following problems. That is, in the above-stated scheme of calculating the power consumption by using a circuit simulator and selecting an optimum cell, a cell of the lowest power consumption is selected through repetitive calculation, thereby requiring an enormous amount of processing time and a long development period. Moreover, by merely performing optimum cell selection, a reducible amount of power consumption is limited. In the above-stated scheme of detecting a changeable cell, no specific measure for achieving this scheme exists so far, and therefore there has been no prospect for putting this scheme into practical use. Moreover, in the above-stated scheme of designing a circuit with a limited function, the operation of a circuit whose specifications are later determined depending on the application to be employed cannot be determined at an early stage in designing. Therefore, this scheme is not effective, either.

After all, in order to reduce power consumption of the circuit, it would be most effective to employ a scheme of reducing a design margin from final design data obtained immediately before a manufacturing process. However, no such scheme effectively achieving quick reduction in the power consumption of the circuit based on the final design data has yet been known. Therefore, currently employed in an actual development process is either one of a scheme of deleting the design margin through trial and error at the cost of the developing period and a scheme of manufacturing a circuit with its design margin untouched at the cost of power consumption.

SUMMARY OF THE INVENTION

Therefore, an object of the present invention is to provide a low-power design method for effectively and quickly reducing an excessive design margin included in the circuit layout results obtained through a top-down design methodology.

The delay amount between cells included in the circuit is determined by an input slew rate, a load capacitance (a total value of an input pin capacitance of the next cell and a wire capacitance), etc. In recent years, in accordance with finer-wire processes, the wire capacitance has become a predominant factor in determining the delay amount between the cells. Particularly, a branching wire tends to be longer than a non-branching wire, and tends to have a large load capacitance. Therefore, in order to drive the next cell via such a branching wire, a cell having a high drive capability is used. However, such a high-capability cell drives at a high speed not only a next cell which requires high-speed drive but also a next cell which does not require high-speed drive. As such, in circuits designed by using a top-down design methodology, some of the next cells connected subsequently to the branching wire are driven at a speed higher than necessary, thereby disadvantageously consuming an excessive power.

In order to get around the above disadvantage, in the present invention, a load-dividing buffer is newly inserted at a predetermined point on a wire subsequent to a branching point, and also the drive capability of a drive cell preceding the branching point is reduced. With this, an excessive margin occurring in the logic synthesis process is reduced, which leads to reduction in the power consumption of the circuit. In more detail, the present invention has a structured as described below.

A first aspect of the present invention is directed to a design method for changing layout results of a semiconductor integrated circuit, the method including the steps of: detecting a branching point of a wire in the layout results including information regarding types of cells, information regarding arrangement of the cells, and information regarding wiring among the cells; virtually inserting a load having a predetermined amount at a predetermined point on one of wires subsequent to the detected branching point; calculating a delay amount of each route connecting cells via the branching point with the load being inserted and a delay amount thereof without the load being inserted; determining, based on the delay amounts of each route, an insertion point at which a load-dividing buffer is to be inserted; calculating a drive capability of a driving cell preceding the insertion point, on condition that the load-dividing buffer is to be inserted at the determined insertion point and based on timing constraints of each route; deciding, based on the layout results, whether the load-dividing buffer is insertable at the insertion point; and performing a process of changing the layout results based on the decision results, the process including a process of placing the load-dividing buffer at the insertion point, a process of changing the driving cell to a cell having the calculated drive capability, and a process of changing wiring information in accordance with circuit changes.

With this, in a case where the driving cell is required to have a high drive capability in order to drive next cells having tight timing constraints and those having not so tight timing constraints, a load-dividing buffer is inserted on a wire subsequent to the branching point, and the drive capability of the driving cell is also reduced. With this, the power consumption of the circuit can be reduced.

In this case, when a delay amount of a route determined under predetermined decision criteria as having tight timing constraints is changed by an amount larger than a predetermined amount with the load being virtually inserted at the predetermined point, the insertion point determining step may determine the predetermined point as the insertion point at which the load-dividing buffer is to be inserted. Alternatively, of routes connecting cells via the branching point, the insertion point determining step may determine a route having tightest timing constraints as having tight timing constraints.

With this, the load-dividing buffer can be inserted at the point which allows reduction in the power consumption of the circuit to be achieved.

Also, the load inserting step may virtually insert the load at the predetermined point on the wire subsequent to the detected branching point when it is determined in accordance with predetermined criteria that the load is required. More preferably, the load inserting step may include the steps of: calculating a total load capacitance after the branching point; calculating a total load capacitance of the driving cell; and virtually inserting the load at the predetermined point on the wire subsequent to the branching point when a ratio of the total load capacitance after the branching point to the total load capacitance of the driving cell is larger than a predetermined value. Alternatively, the load inserting step may include the steps of: calculating, for each of the wires subsequent to the branching point, a total load capacitance after one of the wires; and virtually inserting the load at the predetermined point on the wire so that the total load capacitance after the wire is largest of all total load capacitances for the wires subsequent to the branching point, in a case where the total load capacitances are unbalanced to a degree higher than a predetermined degree. Still alternatively, the load inserting step may include the steps of: calculating, for each of the wires subsequent to the branching point, a worst value of timing constraints of a route including one of the wires; and virtually inserting the load at a predetermined point on a wire whose worst value of timing constraints indicates timing constraints tightest of all the calculated worst values of timing constraints, in a case where the worst values of timing constraints for the wires subsequent to the branching point are unbalanced to a degree higher than a predetermined degree.

As such, by limiting the point at which the load is to be virtually inserted, the number of times of calculating the delay amount of each route with the load being virtually inserted is reduced, thereby reducing the processing time required for the entire design method.

Still further, the layout results changing method according to the first aspect may further includes, prior to the route delay amount calculating step, a step of detecting, in the layout results, a deletable buffer which has no influence on a logic function of the circuit and is connected at an output terminal to the wire having the branching point, wherein the route delay amount calculating step may further calculate a delay amount of a route connecting a cell preceding the deletable buffer and a cell immediately subsequent to the deletable buffer with the deletable buffer being virtually deleted, and the layout results changing step may further perform a process of deleting the deletable buffer from the layout results.

With this, reduction in the power consumption of the circuit can be achieved not only by a buffer adding process but also by a buffer moving process. Therefore, the effect of reduction in the power consumption can be further increased.

A second aspect of the present invention is directed to a method of obtaining delay information regarding delays occurring when load division is performed based on layout results of a semiconductor integrated circuit, the method including the steps of: detecting a branching point on a wire in the layout results including information regarding types of cells, information regarding arrangement of the cells, and information regarding wiring among the cells; virtually inserting a load having a predetermined amount at a predetermined point on a wire subsequent to the detected branching point; and calculating a delay amount of a route connecting cells via the branching point with the load being inserted and a delay amount thereof without the load being inserted.

With the delay information obtained in the above described manner being presented to the designer in an appropriate manner, the designer can easily recognize the situation with regard to load distribution in the circuit.

In this case, the load inserting step may virtually insert the load at the predetermined point on the wire subsequent to the detected branching point when it is determined in accordance with predetermined criteria that the load is required.

As such, by limiting the point at which the load is to be virtually inserted, the number of times of calculating the delay amount of each route with the load being virtually inserted is reduced, thereby reducing the processing time required for the entire design method.

Also, the delay information calculating method according to the second aspect may further include, prior to the route delay amount calculating step, a step of detecting, in the layout results, a deletable buffer which has no influence on a logic function of the circuit and is connected at an output terminal to the wire having the branching point, wherein the route delay amount calculating step may further calculate a delay amount of a route connecting a cell preceding the deletable buffer and a cell immediately subsequent to the deletable buffer with the deletable buffer being deleted.

With this, the designer can easily recognize the delay amount of the route with a buffer being inserted and also the delay amount of the route with a buffer being deleted.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8A and 8B are illustrations showing other layout results for describing the latter half of the processes in the design method according to the first embodiment of the present invention;

FIGS. 17A and 17B are illustrations showing layout results for describing the processes in the design method according to the fifth embodiment of the present invention;

DESCRIPTION OF THE PREFERRED EMBODIMENTS

In the following embodiments, descriptions are made to a method of changing layout results of a semiconductor integrated circuit designed through a top-down design methodology in order to reduce the power consumption of the circuit. In more detail, in each embodiment, description is made to a method of reducing the power consumption of the circuit by inserting, as a load-dividing buffer, a buffer having no influence on a logic function of the circuit in a predetermined point subsequent to a branching point included in the layout results, and by reducing the drive capability of the driving cell preceding the branching point.

The layout results of the circuit include at least information regarding types of cells, information regarding arrangement of the cells, and information regarding wiring among the cells. Each cell corresponds to a logic gate, a flip-flop, a buffer, or the like. A wire connects one cell to one or more cells so that the output terminal of the one cell is connected to the input terminal(s) of the one or more cells. The wire connected to the input terminals of a plurality of cells has one or more branching points, at each of which a wire branches in two or three directions.

In many cases, the method according to each embodiment is achieved by a design tool for semiconductor integrated circuits, which is a computer based system in which a predetermined software program is executed. The design tool may have only a function for performing the method according to each embodiment, or may have, in addition to this function, other functions related to designing of semiconductor integrated circuits. In the following descriptions, it is assumed that the method according to each embodiment is achieved by such a design tool.

(First Embodiment)

Figure 1:
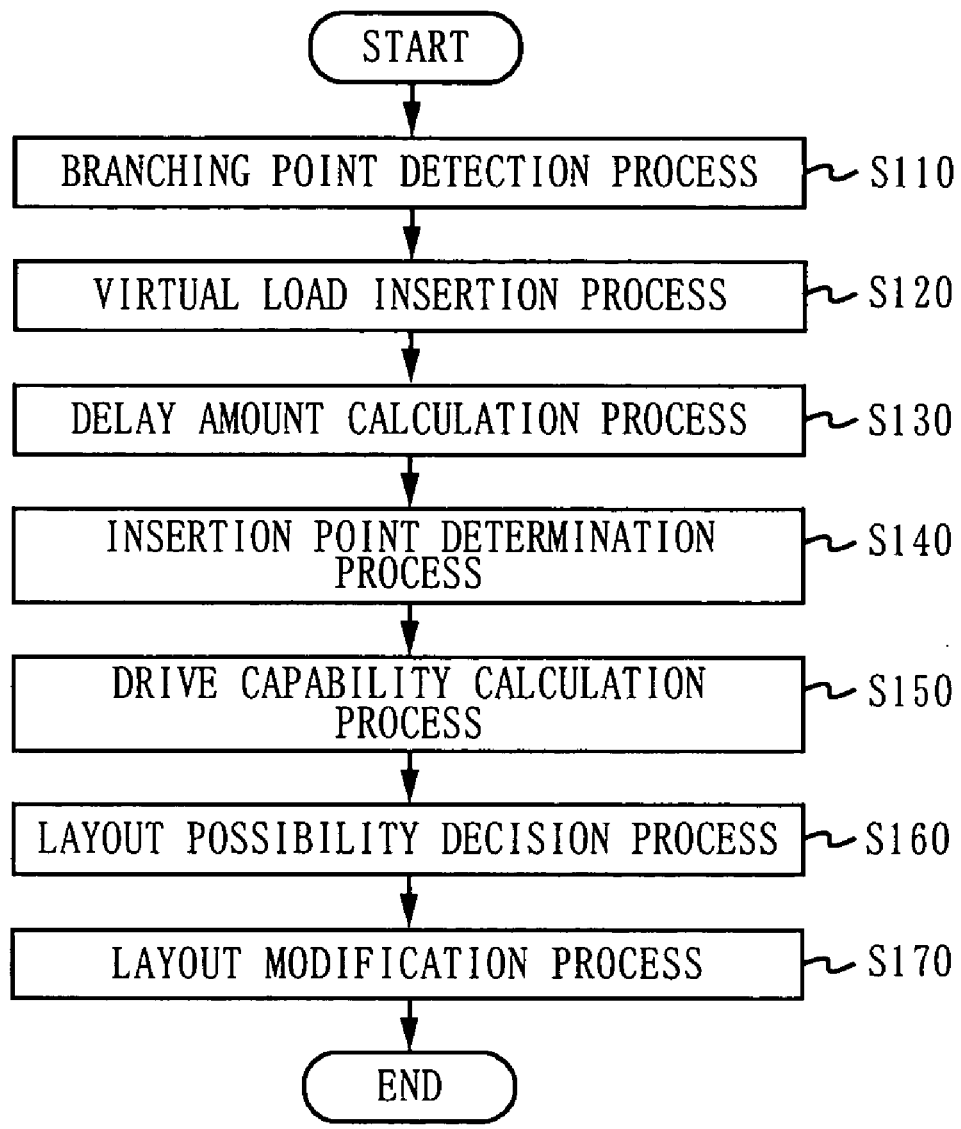
FIG. 1 is a process chart of a design method according to a first embodiment of the present invention.

With reference to FIGS. 1 through 8, a design method according to a first embodiment of the present invention is described. FIG. 1 is a process chart of the design method according to the first embodiment of the present invention. The design method includes a branching point detection process S110, a virtual load insertion process S120, a delay amount calculation process S130, an insertion point determination process S140, a drive capability calculation process S150, a layout possibility decision process S160, and a layout modification process S170.

In the branching point detection process S110, the design tool detects branching points of wires in layout results to be processed. Next, in the virtual load insertion process S120, as for each of the branching points detected in the branching point detection process S110, the design tool virtually inserts, one at a time, a load having a predetermined amount (such a load is hereinafter referred to as a dummy buffer) in a predetermined point on each of the two or three wires subsequent to each branching point (each wire is connected to an input terminal of one cell). Next, in the delay amount calculation process S130, as for each route connecting two cells via a branching point, the design tool calculates a plurality of different delay amounts with a dummy buffer being virtually inserted in the virtual load insertion process S120 and a delay amount without a dummy buffer being inserted.

Next, in the insertion point determination process S140, based on the delay amounts calculated in the delay amount calculation process S130, the design tool determines an insertion point at which a load-dividing buffer should be inserted on one of the wires. In the present embodiment, it is assumed that the design tool determines in the insertion point determination process S140 that a load-dividing buffer should be inserted at a point P if there is a route L which is determined under predetermined criteria as having tight timing constraints and a delay amount of the route L is reduced by an amount larger than a predetermined amount when a dummy buffer is inserted at the point P.

Next, in the drive capability calculation process S150, on condition that a load-dividing buffer is to be inserted at the insertion point determined in the insertion point determination process S140, the design tool calculates the drive capability of a driving cell preceding the insertion point based on the timing constraints on the route. Next, in the layout possibility decision process S160, based on the layout results to be processed, the design tool decides whether a load-dividing buffer is actually insertable in the insertion point found in the insertion point determination process S140.

Next, in the layout modification process S170, for the layout results to be processed, the design tool performs the following process on the insertion point at which it was determined in the layout possibility decision process S160 a load-dividing buffer was allowed to be inserted. That is, the design tool places a load-dividing buffer at the insertion point, changes the driving cell preceding the insertion point to a driving cell having the drive capability calculated in the drive capability calculation process S150, and then changes wiring information in accordance with these two circuit changes.

Figure 2:
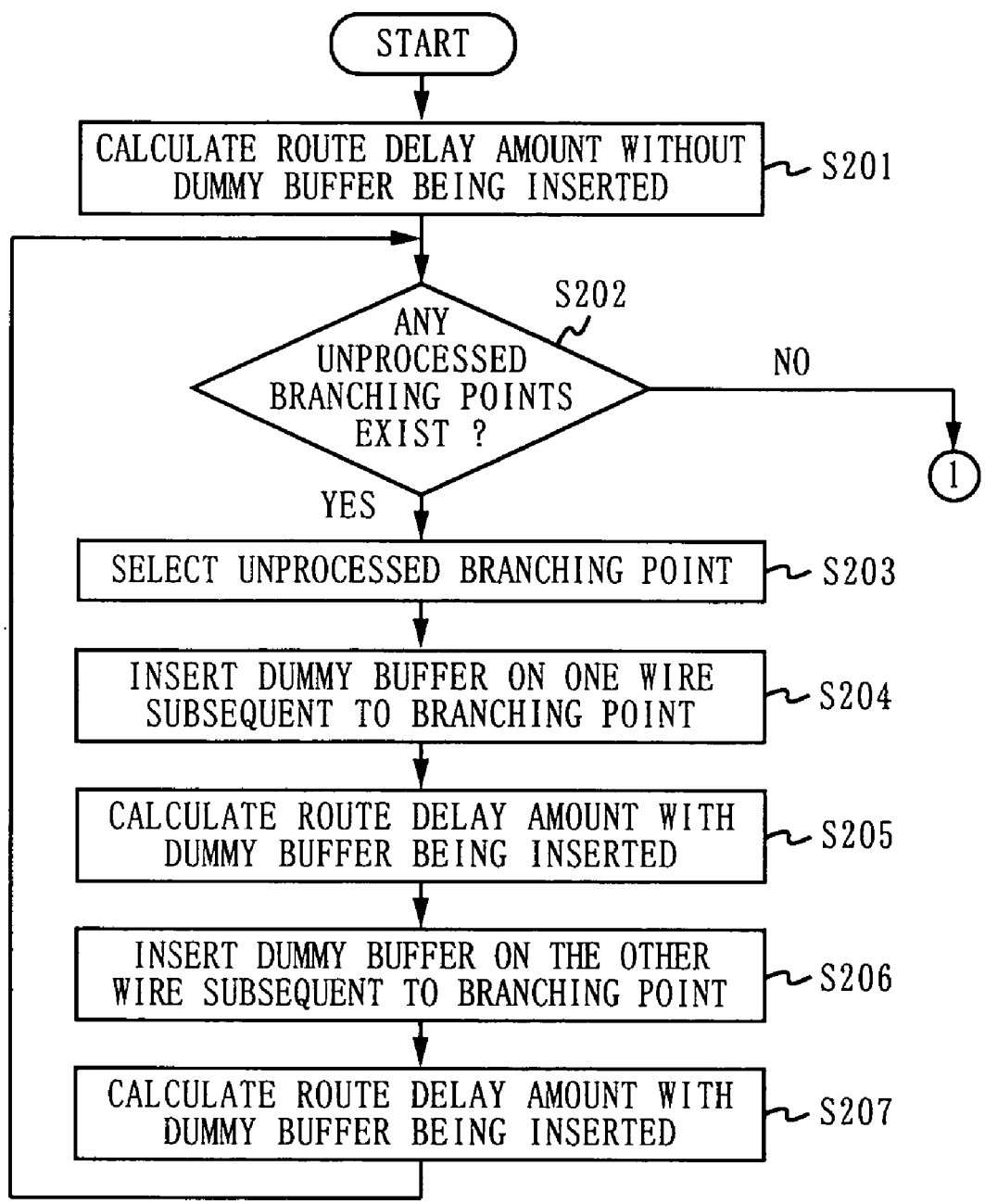
FIG. 2 is a flowchart showing details of a first half of the processes in the design method according to the first embodiment of the present invention.

FIG. 2 illustrates, in a flowchart format, processes from the branching detection process S110 through the delay amount calculation process S130 illustrated in FIG. 1. In comparison between FIGS. 1 and 2, the branching point detection process S110 corresponds to steps S202 and S203, the virtual load insertion process S120 corresponds to steps S204 and S206, and the delay amount calculation process S130 corresponds to steps S201, S205, and S207.

Figure 6:
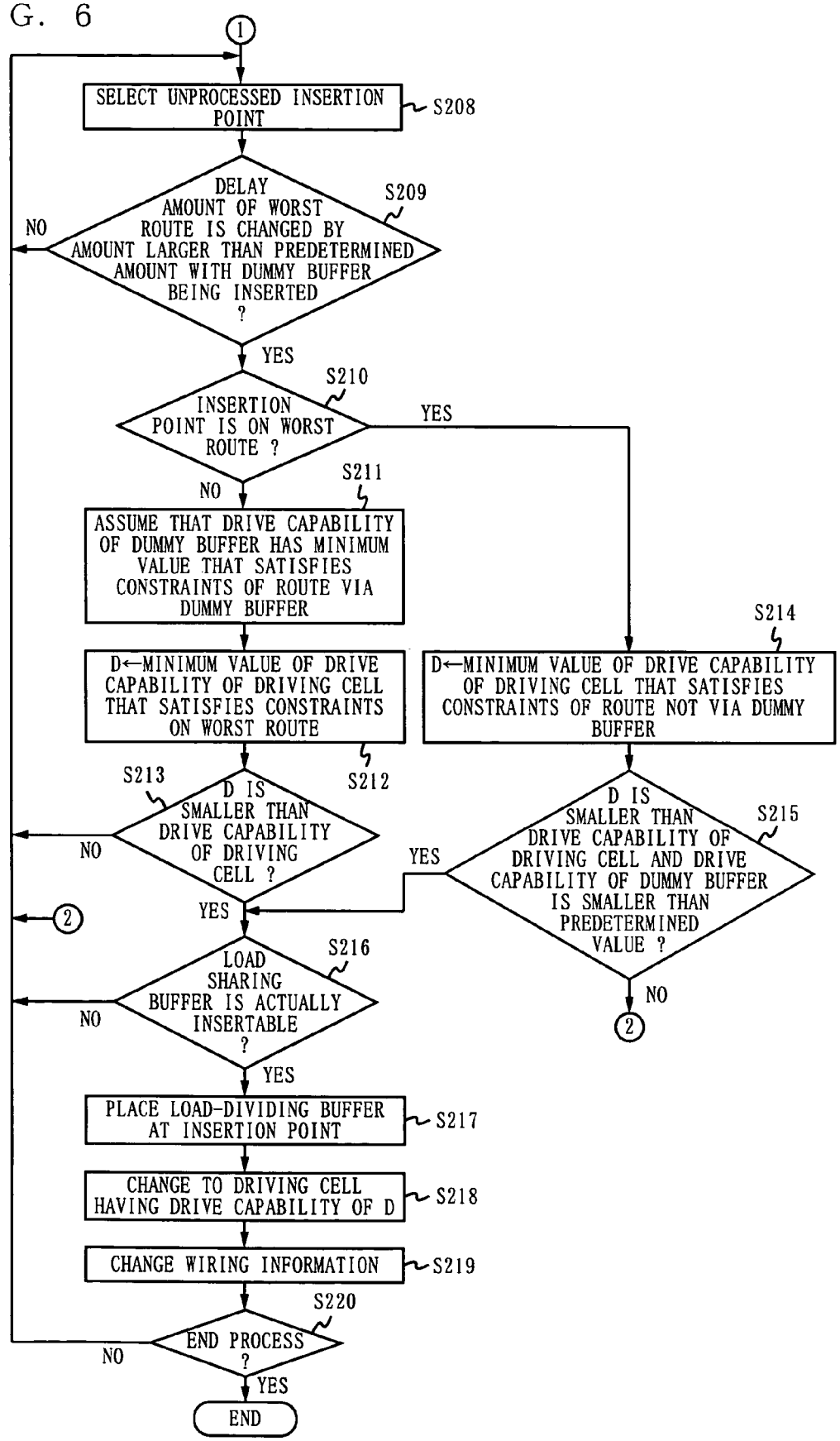
FIG. 6 is a flowchart showing details of the latter half of the processes in the design method according to the first embodiment of the present invention.

As illustrated in FIG. 2, the design tool calculates a delay amount for each route connecting two cells via the branching point on condition that no dummy buffer is inserted (step S201). Next, the design tool determines whether any unprocessed branching points exist in the layout results to be processed (step S202). While any unprocessed branching points exist, processes from steps S203 through S207 described below are repeatedly performed. The design tool selects one unprocessed branching point (step S203), inserts a dummy buffer at a predetermined point on one of two wires subsequent to the selected branching point (step S204), and then calculates a route delay amount with the dummy buffer being inserted (step S205). Next, the design tool inserts a dummy buffer at a point on the other one of the wires subsequent to the selected branching point (step S206), and then calculates a route delay amount with the dummy buffer being inserted (step S207). After performing the processes of steps S203 through S207, the design tool performs the processes starting from the insertion point determination process S140 (FIG. 6).

The insertion point at which a dummy buffer is inserted in the virtual load insertion process S120 may be any point as long as it is on a wire subsequent to the branching point. In order to more effectively reduce the power consumption of the circuit, however, the insertion point is preferably closer to the branching point. Also, it is assumed that the amount of load inserted as a dummy buffer coincides with an input pin capacitance of the load-dividing buffer. Still further, in order to calculate the route delay amount with a dummy buffer being inserted, it is not required to recalculate a delay amount of each of all routes, but the delay amount of a route whose delay amount is changed due to insertion of the dummy buffer. Still further, FIG. 2 illustrates the processes in the case where the wire is branched into two directions. If the wire is branched into three directions, a set of processes of inserting a dummy buffer and calculating a delay amount is performed three times.

Figure 3:
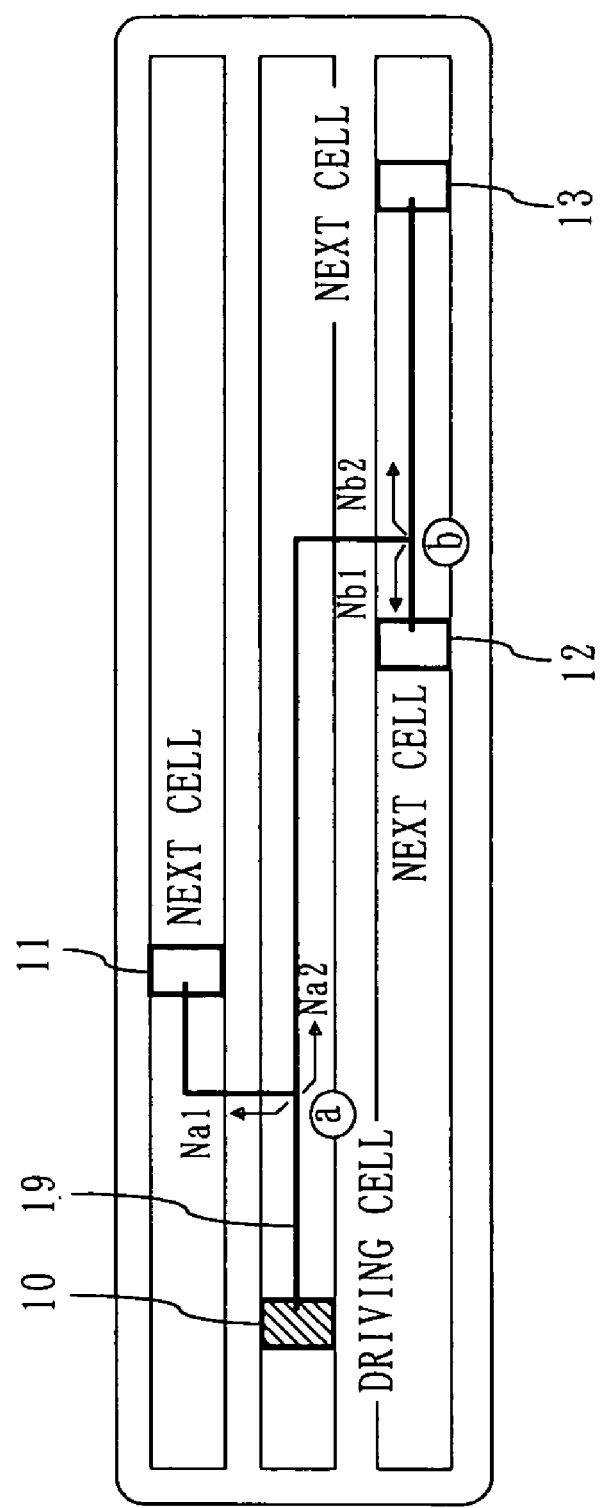
FIG. 3 is an illustration showing layout results for describing the first half of the processes in the design method according to the first embodiment of the present invention.

A specific example of the processes from the branching point detection process S111 through the delay amount calculation process S130 to be performed on the layout results illustrated in FIG. 3 is described below. FIG. 3 illustrates a part of the layout results of a circuit obtained through the standard cell rules. FIG. 3 illustrates, as a part of the layout results, a driving cell 10, three next cells 11 through 13 subsequent to the driving cell 10, and a wire 19. Note that, in the drawings, including FIG. 3, which illustrate the layout results, a cell(s) to be noted is hatched for the purpose of facilitating the understanding of the drawings.

When the layout results illustrated in FIG. 3 are to be processed, in the branching point detection process S110, two branching points a and b are detected in the wire 19. In this example, there are four wires subsequent to the branching points, that is, wires Na1 and Na2 subsequent to the branching point a and wires Nb1 and Nb2 subsequent to the branching point b. Therefore, in the virtual load insertion process S120, a dummy buffer is inserted, one at a time, in a predetermined point on these four wires. That is, a dummy buffer can be inserted on the wire 19 in four different ways. Also, in the present example, there are three routes for connecting two cells via the branching point a or b, that is, a route from the driving cell 10 to the next cell 11, a route from the driving cell 10 to the next cell 12, and a route from the driving cell 10 to the next cell 13. Therefore, in the delay amount calculation process S130, five different delay amounts are calculated for each of these three routes. The five different delay amounts are: a delay amount without a dummy buffer being inserted; a delay amount with a dummy buffer being inserted at a predetermined point on the wire Na1; a delay amount with a dummy buffer being inserted at a predetermined point on the wire Na2; a delay amount with a dummy buffer being inserted at a predetermined point on the wire Nb1; and a delay amount with a dummy buffer being inserted at a predetermined point on the wire Nb2.

Figure 4:
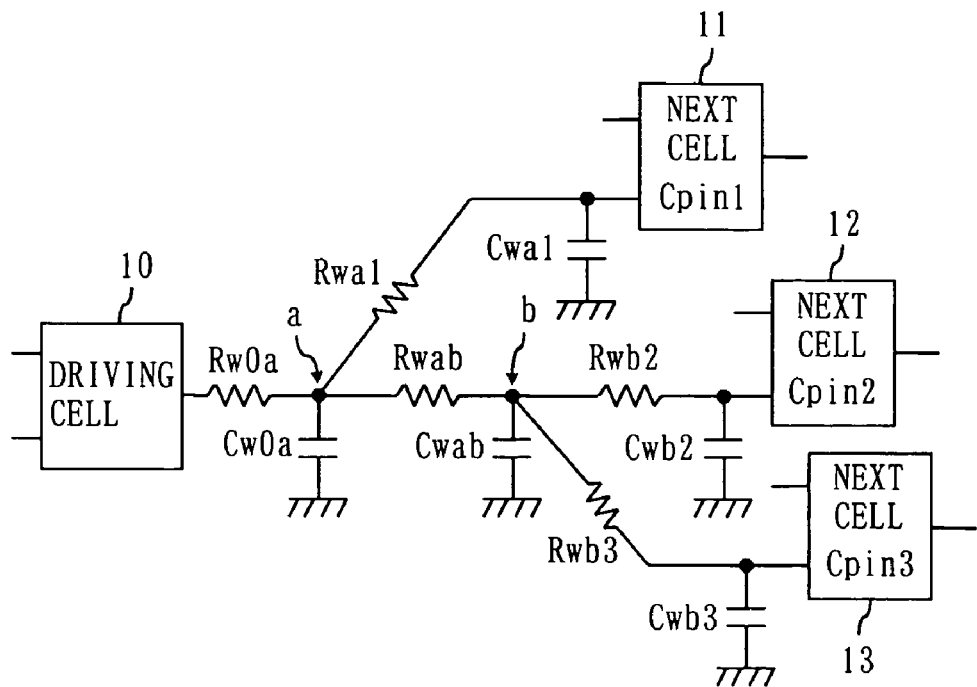
FIG. 4 is an illustration showing resistance components and capacitance components in a circuit illustrated in FIG. 3.

Route delay amounts are calculated in a manner as described below, for example. In order to calculate route delay amounts without a dummy buffer being inserted, as illustrated in FIG. 4, resistance components (denoted as RwXX, where X is an arbitrary character, which goes for the following) and capacitance components (denoted as CwXX) on the wires are extracted from the layout results illustrated in FIG. 3. Also, input pin capacitances (denoted as CpinX) of the next cells are read from data regarding characteristics of the cells. Then, the route delay amounts are calculated in accordance with a predetermined delay calculation model. In this example, a delay amount of a route from the driving cell 10 to the next cell 11 is equal to a total of a cell delay tg0 at the driving cell 10 and a wire delay tw01 from the driving cell 10 to the next cell 11. Also, a delay amount of a route from the driving cell 10 to the next cell 12 is equal to a total of the cell delay tg0 and a wire delay tw02 from the driving cell 10 to the next cell 12. Still further, a delay amount of a route from the driving cell 10 to the next cell 13 is equal to a total of the cell delay tg0 and a wire delay tw03 from the driving cell 10 to the next cell 13. Here, it is assumed that the cell delay is calculated by using a function F together with an input slew rate input_slew and an output load capacitance as input parameters, and the wire delays are calculated by using a wire approximation scheme, such as the Elmore approximation scheme. Under these assumptions, the delay amounts t01 through t03 of the routes without a dummy buffer being inserted are calculated by the following equations (1) through (6).

$$t01 = tg0 + tw01 \qquad (1)$$
$$= tg0 + Rw0a \cdot C1 + Rwa1(Cwa1 + Cpin1)$$

$$t02 = tg0 + tw02 \qquad (2)$$
$$= tg0 + Rw0a \cdot C1 + Rwab \cdot C2 + Rwb2(Cwb2 + Cpin2)$$

$$t03 = tg0 + tw03 \qquad (3)$$
$$= tg0 + Rw0a \cdot C1 + Rwab \cdot C2 + Rwb3(Cwb3 + Cpin3)$$

$$tg0 = F(input\_slew, C1) \qquad (4)$$

$$C1 = Cw0a + Cwa1 + Cpin1 + C2 \qquad (5)$$

$$C2 = Cwab + Cwb2 + Cwb3 + Cpin2 + Cpin3 \qquad (6)$$

Figure 5:
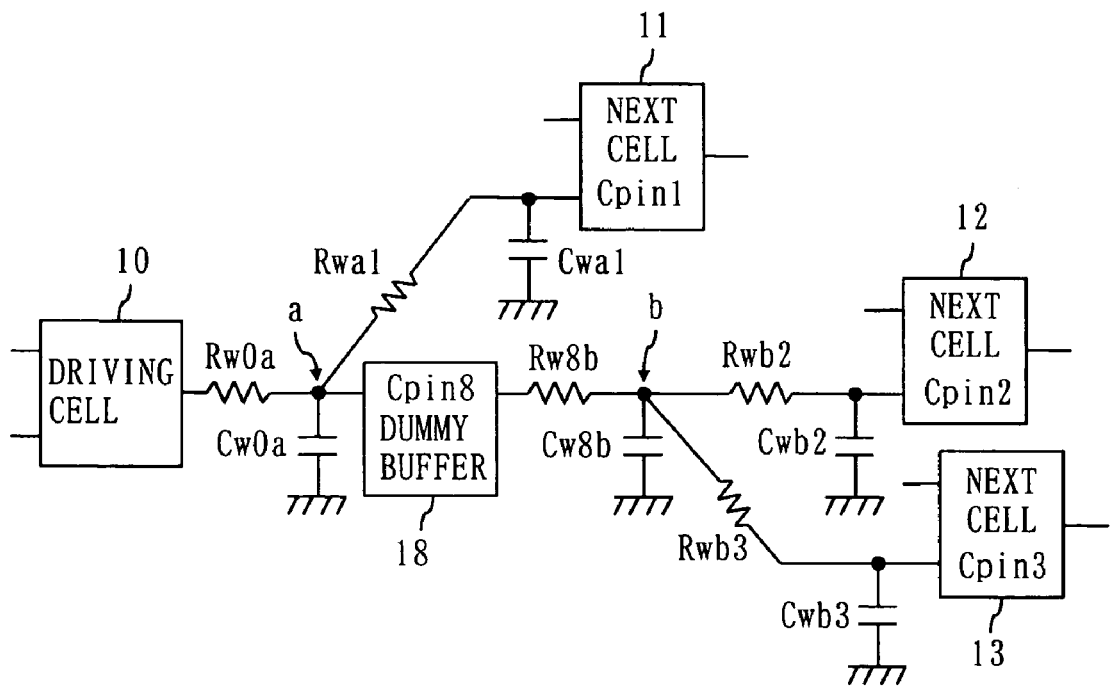
FIG. 5 is an illustration showing resistance components and capacitance components in the circuit illustrated in FIG. 3 with a dummy buffer being inserted therein.

Also, in order to calculate route delay amounts with a dummy buffer being inserted, resistance components and capacitance components are calculated with a dummy buffer being inserted based on the resistance components and the capacitance components without a dummy buffer being inserted. For example, in order to calculate a delay amount of the route with a dummy buffer 18 being inserted at the predetermined point on the wire Na2 illustrated in FIG. 3, the resistance component and the capacitance components illustrated in FIG. 4 are changed so that the wire resistance Rwab is replaced by a wire resistance Rw8b, and the input pin capacitance Cwab is replaced by an input pin capacitance Cpin8 of the dummy buffer 18 and a wire capacitance Cw8b, as illustrated in FIG. 5. A delay amount T01 of the route from the driving cell 10 to the next cell 11 with the dummy buffer 18 being inserted is equal to the total of the cell delay Tg0 at the driving cell 10 and the wire delay Tw01 from the driving cell 10 to the next cell 11. A delay amount T02 on the route from the driving cell 10 to the next cell 12 is equal to the total of the cell delay Tg0, a wire delay Tw08 from the driving cell 10 to the dummy buffer 18, a cell delay Tg8 at the dummy buffer 18, and a wire delay Tw82 from the dummy buffer 18 to the next cell 12. A delay amount T03 of the route from the driving cell 10 to the next cell 13 is calculated in a manner similar to the above. That is, the route delay amounts T01 through T03 with the dummy buffer 18 being inserted are calculated by using the following equations (7) through (13).

$$T01 = Tg0 + Tw01 \qquad (7)$$
$$= Tg0 + Rw0a \cdot C3 + Rwa1(Cwa1 + Cpin1)$$

-continued $$T02 = Tg0 + Tw08 + Tg8 + Tw82 \qquad (8)$$
$$= Tg0 + Rw0a \cdot C3 + Tg8 + Rw8b \cdot C4 +$$
$$Rwb2(Cwb2 + Cpin2)$$

$$T03 = Tg0 + Tw08 + Tg8 + Tw83 \qquad (9)$$
$$= Tg0 + Rw0a \cdot C3 + Tg8 + Rw8b \cdot C4 +$$
$$Rwb3(Cwb3 + Cpin3)$$

$$Tg0 = F(input\_slew, C3) \qquad (10)$$

$$Tg8 = F(input\_slew, C4) \qquad (11)$$

$$C3 = Cw0a + Cwa1 + Cpin1 + Cpin8 \qquad (12)$$

$$C4 = Cw8b + Cwb2 + Cwb3 + Cpin2 + Cpin3 \qquad (13)$$

FIG. 6 illustrates, in a flowchart format, processes from the insertion point determination process S140 through the layout modification process S170 illustrated in FIG. 1. In the present embodiment, in the insertion point determination process S140, the design tool finds a route having timing constraints that are tightest among those of routes connecting cells via the same branching point, and then determines that a load-dividing buffer should be inserted at a point which allows a delay amount of the route having the tightest timing constrains to be reduced by an amount larger than a predetermined amount. In comparison between FIGS. 1 and 6, the insertion point determination process S140 corresponds to steps S208, S209, and S220, the drive capability calculation process S150 corresponds to steps S210 through S215, the layout possibility decision process S160 corresponds to steps S216, and the layout modification process S170 corresponds to steps S217 through S219.

By the time of completion of the delay amount calculation process S130, a plurality of different delay amounts with a dummy buffer being inserted and a delay amount without a dummy buffer being inserted have been calculated for the routes connecting any two cells. The design tool selects one unprocessed insertion point from the points in which a dummy buffer is once inserted in step S204 or S206 (step S208). The selected insertion point is hereinafter referred to as an insertion point P. Next, the design tool determines whether a delay amount of a route having timing constraints that are tightest among those of routes from the driving cell preceding the insertion point P to the next cell subsequent to the driving cell (such a route is hereinafter referred to as a worst route) is changed by an amount larger than a predetermined amount with a dummy buffer being inserted at the intersection point P (step S209). If the delay amount of the worst route is changed by the amount larger than the predetermined amount, the design tool determines whether the insertion point P is on the worst route (step S210). If the insertion point P is on the worst route, the design tool goes to step S214. Otherwise, the design tool goes to step S221.

If the insertion point P is not on the worst route (No in step S210), the design tool assumes that the dummy buffer is set to have a minimum drive capability so as to satisfy timing constraints on all routes passing through the dummy buffer (step S211). Under this assumption, the design tool calculates a minimum value D of the drive capability of the driving cell that satisfies the timing constraints on the worst route (step S212). Next, the design tool compares the drive capability calculated in step S212 with the drive capability of the driving cell included in the original circuit (step S213). If the calculated drive capability is lower than the original drive capability, the design tool goes to step S216.

On the other hand, if the insertion point P is on the worst route (Yes in step S210), the design tool calculates a minimum value D of the drive capability of the driving cell that satisfies timing constraints on all routes not passing through the dummy buffer (step S214). The design tool then determines whether the minimum value D of the drive capability calculated in step S214 is lower than the drive capability of the driving cell included in the original circuit and whether the drive capability of the dummy buffer is smaller than the predetermined value (step S215). If these two conditions are satisfied, the design tool goes to step S216.

If the control procedure of the design tool arrives at step S216, that means that a load-dividing buffer should be inserted at the insertion point selected in step S208. Therefore, based on the layout results to be processed, the design tool decides whether a load-dividing buffer is actually insertable at the insertion point P (step S216). If a load-dividing buffer is actually insertable, the design tool goes to step S217. In this case, the design tool performs a layout modification process described below on the layout results to be processed. That is, the design tool places a load-dividing buffer at the insertion point P (step S217), changes the driving cell preceding the insertion point P to a cell having the drive capability calculated in step S212 or S214 (step S218), and then changes wiring information in accordance with these two circuit changes (step S219).

Next, the design tool determines whether to end the control procedure in accordance with predetermined decision criteria (step S220). For example, the design tool may determine to end the control procedure upon completion of processing all insertion points in which a dummy buffer is once inserted in step S204 or S206, or upon completion of performing a layout modification process for a predetermined number of times. Upon determination of continuing the control procedure, the design tool goes to step S208. Upon determination of ending the control procedure, the design tool ends the control procedure. Note that, if No is determined in any one of steps S209, S213, S215 and S216, the design tool goes to step S208 without performing a layout modification process on the insertion point P.

Figure 7A:
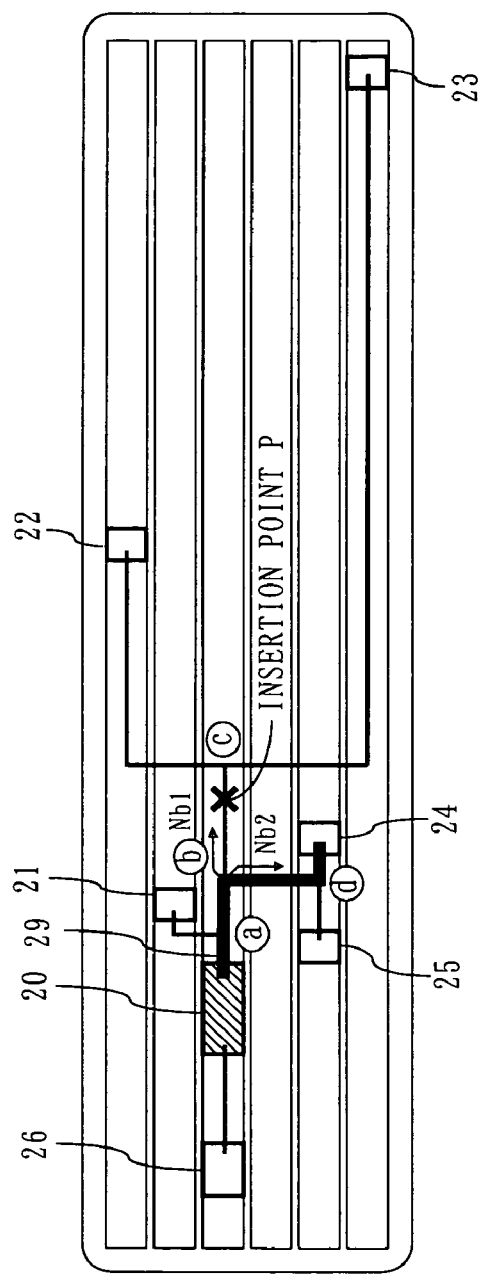
FIGS. 7A and 7B are illustrations showing layout results for describing the latter half of the processes in the design method according to the first embodiment of the present invention.

A specific example of the processes from the insertion point determination process S140 through the layout modification process S170 to be performed on the layout results illustrated in FIG. 7A is described below. FIG. 7A illustrates a part of the layout results of a circuit obtained through the standard cell rules. FIG. 7A illustrates, as a part of the layout results, a driving cell 20, five next cells 21 through 25, a previous cell 26 preceding the driving cell 20, and a wire 29. The wire has four branching points a through d for connecting the output terminal of the driving cell 20 to the input terminals of the next cells 21 through 25.

When the layout results illustrated in FIG. 7A are to be processed, in the branching point detection process S110, four branching points a through d are detected in the wire 29. In the virtual load insertion process S120, a dummy buffer is inserted, one at a time, in any one of two points for each of the four branching points a through d, that is, in any one of eight points. Here, it is assumed that a route from the driving cell 20 to the next cell 24 (indicated by a bold line) is a route having timing constraints that are tightest among those of five routes from the driving cell 20 to the next cells 21 through 25 (that is, a worst route). Also, as for the delay amount of the route from the driving cell 20 to the next cell 24, it is assumed that, of eight different delay amounts each obtained with a dummy buffer being inserted at any one of the eight points subsequent to the branching points a through d and a delay amount obtained without a dummy buffer being inserted, the delay amount with a dummy buffer being inserted at a predetermined point P illustrated in FIG. 7A on a wire Nb1 subsequent to the branching point b is minimum.

Figure 7B:
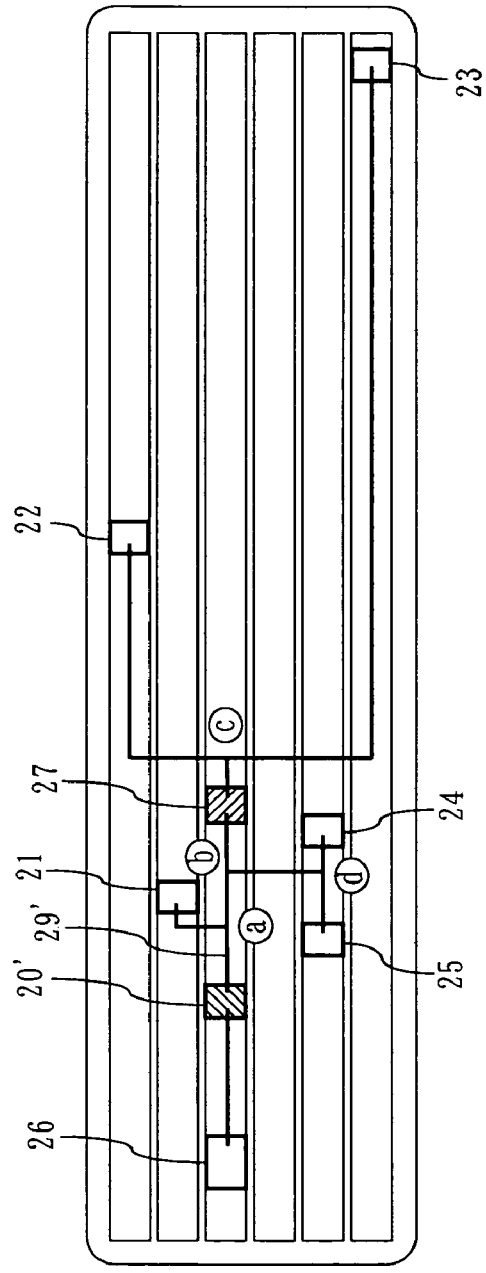

As for the layout result illustrated in FIG. 7A, upon selection in step S208 of the insertion point P, Yes is determined in step S209, and then No is determined in step S210. Next, in step S212, what is calculated is a minimum value D of the drive capability of the driving cell 20 that satisfies the timing constraints on the route from the driving cell 20 to the next cell 24. Then, upon determination in step S213 that the calculated minimum value D is smaller than the drive capability of the driving cell 20 and upon determination in step S216 that a load-dividing buffer is insertable in the insertion point P, the layout modification process described below is performed. That is, a load-dividing buffer 27 is placed at the insertion point P (step S217), the driving cell 20 is replaced by a driving cell 20' of a lower drive capability (step S218), and then wiring information regarding the wires connected to the load-dividing buffer 27 and the driving cell 20' is changed (step S219). As a result, the layout results illustrated in FIG. 7A are changed to those as illustrated in FIG. 7B.

In the layout results before change (FIG. 7A), a wire 29 is long, and therefore the load capacitance of the driving cell 20 is large. For this reason, a driving cell of a high drive capability is used as the driving cell 20. In the layout results after change (FIG. 7B), on the other hand, the load-dividing buffer 27 is inserted at the insertion point P. This makes a wire 29' corresponding to the wire 29 shorter than the wire 29, thereby reducing the load capacitance of the driving cell 20. For this reason, in place of the driving cell 20, a driving cell 20' of a drive capability lower than that of the driving cell 20 can be used. Furthermore, the drive capability of the driving cell 20' is calculated so as to satisfy the timing constraints on each of the routes including the worst route. Therefore, even with changes of the layout results as illustrated in FIG. 7B, the timing constraints are not violated. Thus, according to the design method of the present invention, the drive capability of the driving cell 20 can be reduced with the timing constraints on each route being satisfied, thereby reducing the power consumption of the circuit without impairing the functions of the circuit.

As described above, according to the design method of the present embodiment, in a case where a driving cell drives a plurality of next cells and, although a route having tight timing constraints is short, the driving cell is required to have a high drive capability due to a large total value of wire capacitances and input pin capacitances of the next cells, a load-dividing buffer for driving a next cell having less timing constraints is inserted and the drive capability of the driving cell is reduced. With this, the power consumption of the circuit can be reduced.

Next, another specific example of the processes from the insertion point determination process S140 through the layout modification process S170 to be performed on layout results illustrated in FIG. 8A is described below. The arrangement of the cells and wiring among the cells in FIG. 8A are identical to those illustrated in FIG. 7A. However, in the layout results illustrated in FIG. 8A, it is assumed that, of five routes from the driving cell 30 to the next cells 31 through 35, the route from the driving cell 30 to the next cell 33 (indicated by a bold line) is a route having tightest timing constraints (a worst route). Also, as for the delay amount of the route from the driving cell 30 to the next cell 33, it is assumed that, of eight different delay amounts each obtained with a dummy buffer being inserted at any one of the eight points subsequent to the branching points a through d and a delay amount obtained without a dummy buffer being inserted, the delay amount with a dummy buffer being inserted at a predetermined point Q illustrated in FIG. 8A on a wire Nc2 subsequent to the branching point c is minimum.

As for the layout result illustrated in FIG. 8A, upon selection in step S208 of the insertion point Q, Yes is determined in steps S209 and S210. Next, in step S214, what is calculated is a minimum value D of the drive capability of the driving cell 30 that satisfies the timing constraints on all routes not passing through a dummy buffer. Then, upon determination in step S215 that the two conditions are satisfied and upon determination in step S216 that a load-dividing buffer is insertable at the insertion point Q, the layout modification process described below is performed. That is, a load-dividing buffer 37 is placed at the insertion point Q (step S217), the driving cell 30 is replaced by a driving cell 30' having a drive capability lower than that of the driving cell 30 (step S218), and then wiring information regarding the wires connected to the load-dividing buffer 37 and the driving cell 30' is changed (step S219). As a result, the layout results illustrated in FIG. 8A are changed to those as illustrated in FIG. 8B. With the layout results being changed in the above-described manner, the power consumption of the circuit can be reduced because of the same reason as that applied to the layout results in FIG. 7A.

As described above, according to the design method of the present embodiment, in a case where a driving cell drives a small number of next cells having tight timing constraints and a large number of next cells having not so tight timing constraints and the driving cell is required to have a high drive capability due to a large total value of wire capacitances and input pin capacitances of the next cells, a load-dividing buffer is newly inserted on a route having tight timing constraints so as to selectively perform high-speed driving at a portion around that route and the drive capability of the driving cell is reduced. With this, the power consumption of the circuit can be reduced.

In the flowchart illustrated in FIG. 6, the layout modification process is performed in both of the cases where the insertion point is on the worst route and where the insertion point is not on the worst route. Alternatively, the layout modification process may be limited so as to be performed only in either one of the cases. Such a design process can be easily achieved by causing the design tool to go to step S208 after Yes (or No) is determined in step S210 of FIG. 6.

(Second Embodiment)

Figure 9:
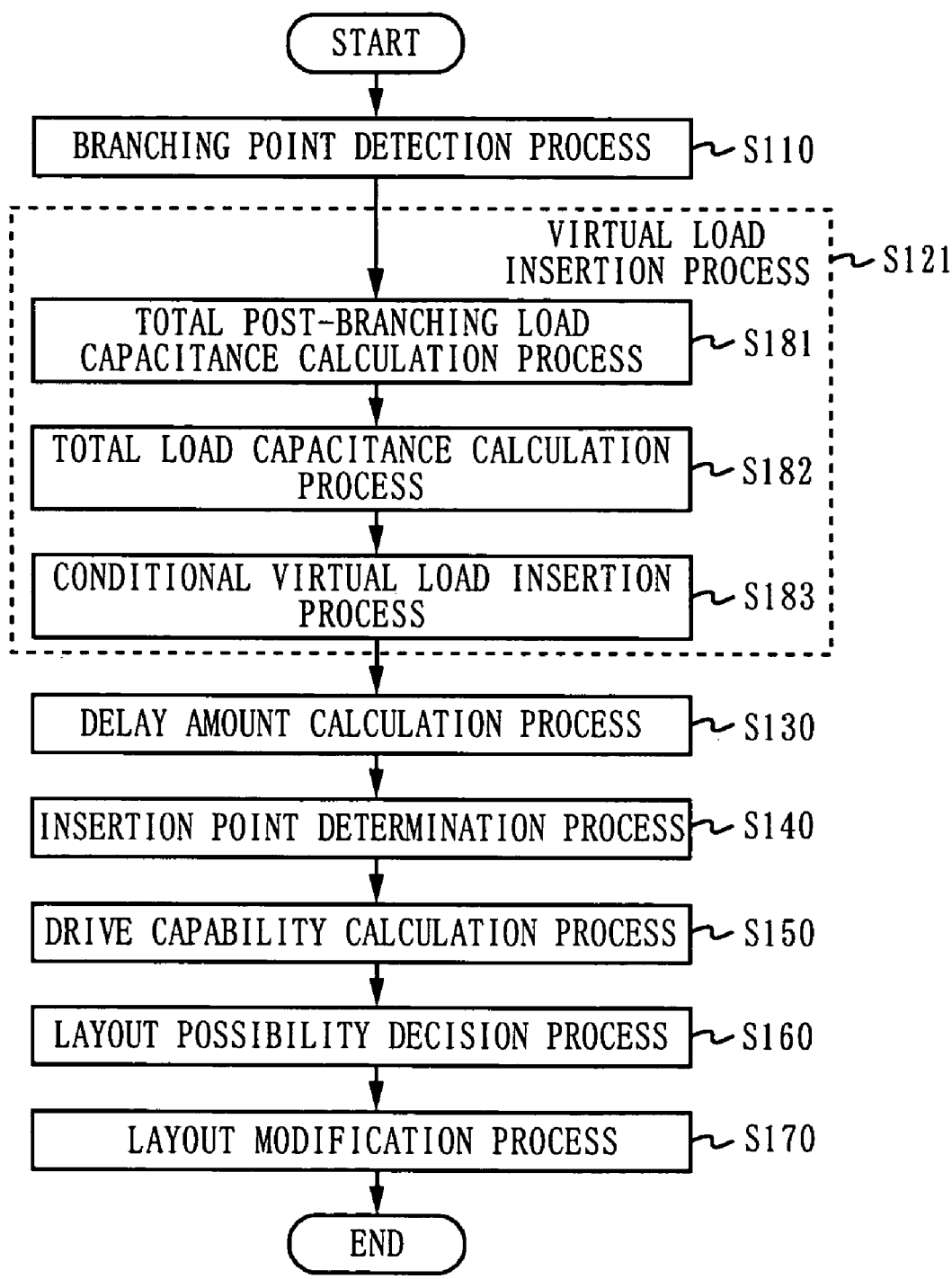
FIG. 9 is a process chart of a design method according to a second embodiment of the present invention.
Figure 10:
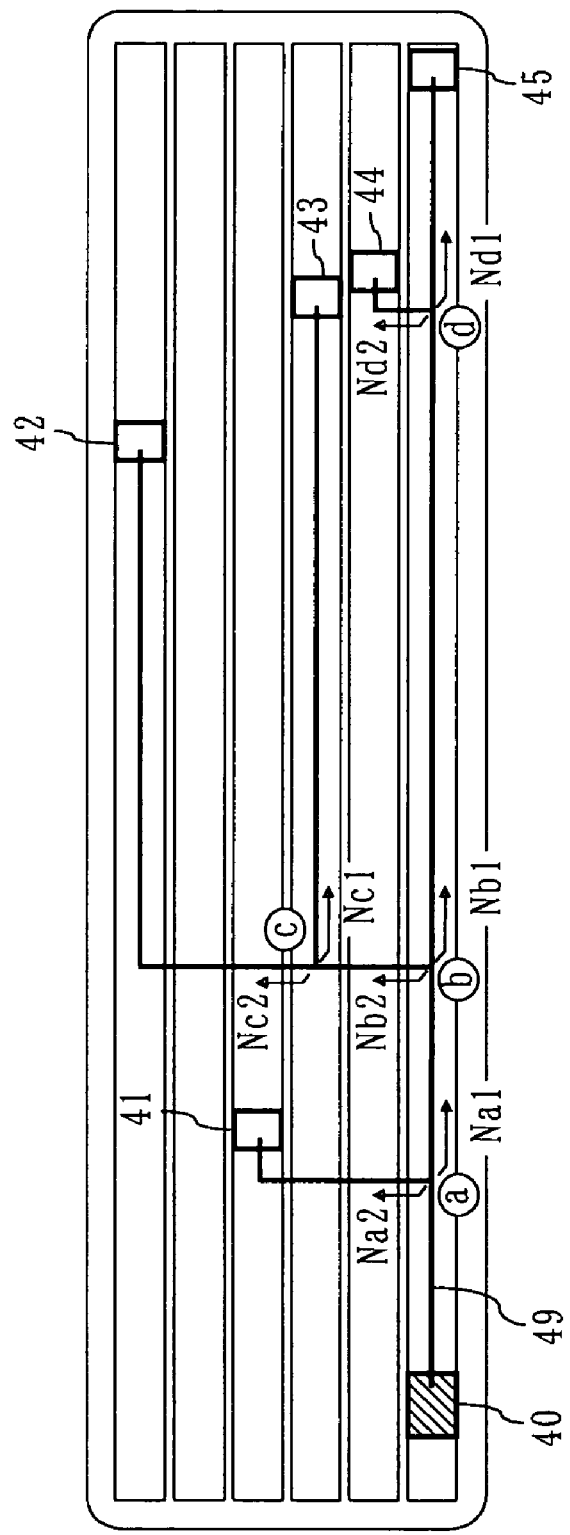
FIG. 10 is an illustration showing layout results for describing reduction in processing time achieved by the design method according to second through fourth embodiments of the present invention.

With reference to FIGS. 9 and 10, a second embodiment of the present invention is described below. FIG. 9 is a process chart of a design method according to the second embodiment of the present invention. The present design method is obtained by replacing the virtual load insertion process S120 included in the design method according to the first embodiment (FIG. 1) by a virtual load insertion process S121 that is different from the process S120. Of the processes illustrated in FIG. 9, processes identical to those illustrated in FIG. 1 are provided with the same reference numerals and are not described herein.

In the virtual load insertion process S121, the design tool determines in accordance with predetermined criteria whether a dummy buffer is required and, upon determination that a dummy buffer is required, then inserts a dummy buffer at a predetermined point on a wire subsequent to the branching point detected in the branching point detection process S110. The virtual load insertion process S121 according to the present embodiment includes a total post-branching load capacitance calculation process S181, a total load capacitance calculation process S182, and a conditional virtual load insertion process S183. In the total post-branching load capacitance calculation process S181, the design tool calculates, for each branching point, a total load capacitance Cpart after the branching point (a total value of wire capacitances after the branching point and input pin capacitances of cells subsequent to the branching point, which is hereinafter referred to as a total post-branching load capacitance). Next, in the total load capacitance calculation process S182, the design tool calculates, for each branching point, a total load capacitance Call of the driving cell preceding each branching point (hereinafter simply referred to as "a total load capacitance"). Next, in the conditional virtual load insertion process S183, if there is a branching point whose ratio of the total post-branching load capacitance Cpart to the total load capacitance Call is larger than a predetermined value, the design tool inserts a dummy buffer at a predetermined point subsequent to that branching point on the wire. Otherwise, the design tool does not insert a dummy buffer subsequent to that branching point on the wire.

A specific example of the virtual load insertion process S121 to be performed on layout results illustrated in FIG. 10 is described below. In the total post-branching load capacitance calculation process S181, as for a branching point b, for example, a total value of wire capacitances from the branching point b to next cells 42 through 45 and input pin capacitances of the next cells 42 through 45 is calculated as a total post-branching load capacitance Cpart-b. Also, as for a branching point d, a total value of wire capacitances from the branching point d to the next cells 44 and 45 and input pin capacitances of the next cells 44 and 45 is calculated as a total post-branching load capacitance Cpart-d. Next, in the total load capacitance calculation process S182, a total value of wire capacitances from a driving cell 40 to the next cells 41 through 45 and input pin capacitances of the next cells 41 through 45 is calculated as a total load capacitance Call.

In the layout results illustrated in FIG. 10, a ratio of the total post-branching load capacitance Cpart-b to the total load capacitance Call is relatively large. Therefore, if a dummy buffer is inserted at a predetermined point on a wire subsequent to the branching point b, there is a high possibility that the delay amount of the route having timing constraints tighter than a predetermined degree is changed by an amount larger than a predetermined amount. Therefore, inserting a dummy buffer can be expected to be effective. On the other hand, a ratio of the total post-branching load capacitance Cpart-d to the total load capacitance Call is relatively small. Therefore, if a dummy buffer is inserted at a predetermined point on a wire subsequent to the branching point d, there is a low possibility that the delay amount of the route having timing constraints tighter than the predetermined degree is changed by an amount larger than the predetermined amount. Therefore, inserting a dummy buffer is not expected to be effective.

In the conditional virtual load insertion process S183, if the ratio of the total post-branching load capacitance Cpart to the total load capacitance Call is larger than a predetermined value (for example, as is the case for the branching point b illustrated in FIG. 10), a dummy buffer is inserted. If the ratio is not larger than the predetermined value (for example, as is the case for the branching point d illustrated in FIG. 10), a dummy buffer is not inserted. With this, in the conditional virtual load insertion process S183, the point at which a dummy buffer is inserted is limited to a point which allows the power consumption of the circuit to be effectively reduced.

In the delay amount calculation process S130, the delay amount of each route is calculated for the case where a dummy buffer is inserted in the virtual load insertion process S121. Also, as described above, in the virtual load insertion process S121, the point at which a dummy buffer is inserted is limited to a point which allows the power consumption of the circuit to be effectively reduced. Therefore, in the delay amount calculation process S130, the number of times of calculating the delay amount of each route is reduced, thereby reducing the processing time.

As described above, according to the design method of the present embodiment, by limiting the point at which a dummy buffer is inserted, the number of times of calculating the delay amount of each route is reduced, thereby reducing the processing time required for the entire design method.

(Third Embodiment)

Figure 11:
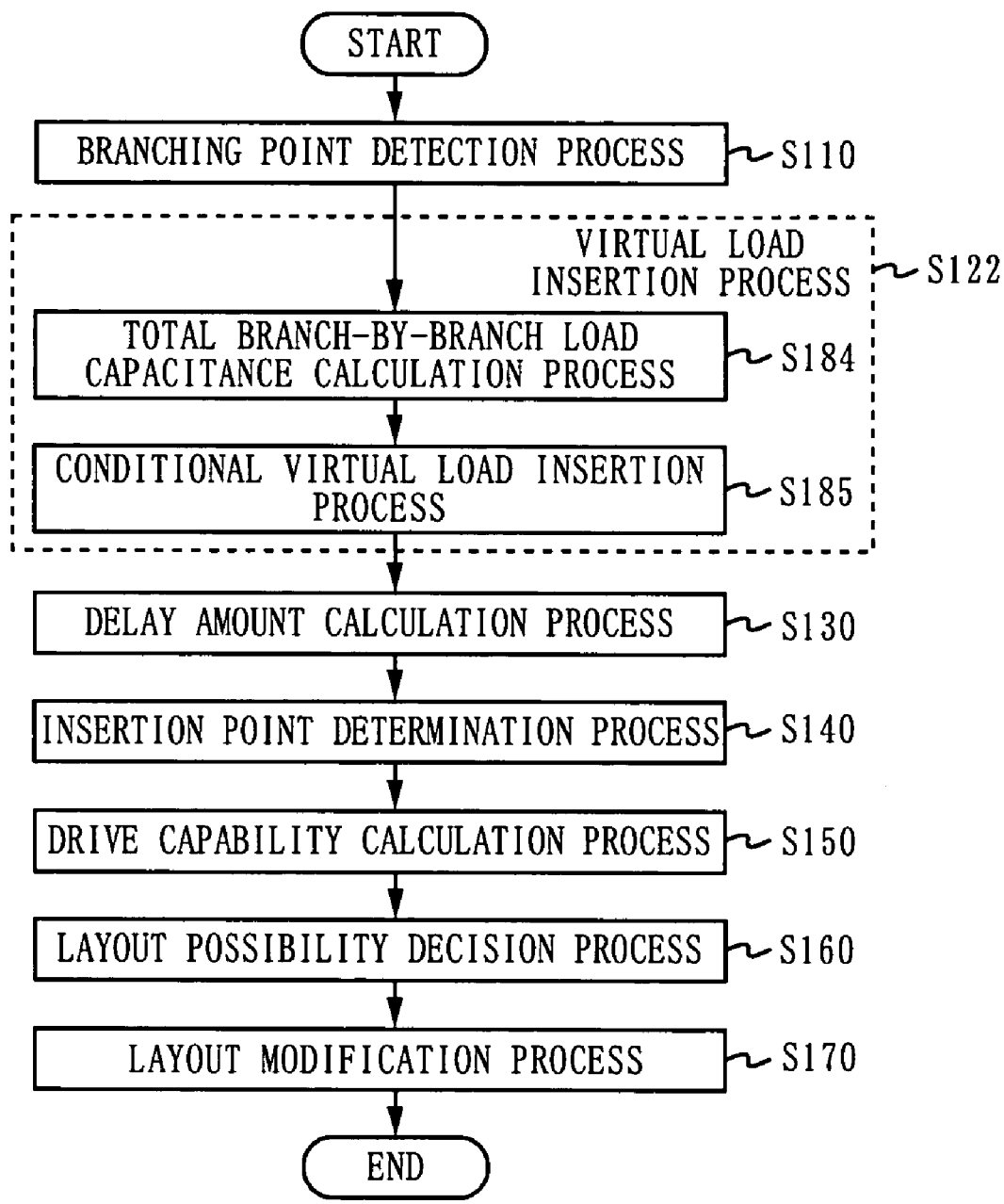
FIG. 11 is a process chart of a design method according to a third embodiment of the present invention.

With reference to FIGS. 10 and 11, a third embodiment of the present invention is described below. FIG. 11 is a process chart of a design method according to the third embodiment of the present invention. The present design method is obtained by replacing the virtual load insertion process S120 included in the design method according to the first embodiment (FIG. 1) by a virtual load insertion process S122 that is different from the process S120. Of the processes illustrated in FIG. 11, processes identical to those illustrated in FIG. 1 are provided with the same reference numerals and are not described herein.

As with the virtual load insertion process S121 according to the second embodiment, in the virtual load insertion process S122, the design tool determines in accordance with predetermined criteria whether a dummy buffer is required and, upon determination that a dummy buffer is required, then inserts a dummy buffer at a predetermined point on a wire subsequent to the branching point detected in the branching point detection process S110. The virtual load insertion process S122 according to the present embodiment includes a total branch-by-branch load capacitance calculation process S184 and a conditional virtual load insertion process S185. In the total branch-by-branch load capacitance calculation process S184, the design tool calculates, for each wire subsequent to the branching point detected in the branching point detection process S110, a total load capacitance after that wire (hereinafter referred to as a total branch-by-branch load capacitance). In more detail, consider a case of a branching point at which a wire branches in two directions to a wire W1 and a wire W2. In this case, as a total branch-by-branch load capacitance Cw1 for the wire W1, the design tool calculates a total value of a wire capacitance after the wire W1 and an input pin capacitance of a cell(s) connected to the wire W1. Similarly, the design tool calculates a total branch-by-branch load capacitance Cw2 for the wire W2.

Next, in the conditional virtual load insertion process S185, the design tool compares the total branch-by-branch load capacitance Cw1 for the wire W1 and the total branch-by-branch load capacitance Cw2 for the wire W2. If these capacitances are unbalanced to a degree higher than a predetermined degree, the design tool inserts a dummy buffer at a predetermined point on a wire whose total branch-by-branch load capacitance is larger than that of the other. That is, if the total branch-by-branch load capacitance Cw1 is larger than the total branch-by-branch load capacitance Cw2 by a value larger than a predetermined value, a dummy buffer is inserted at a predetermined point on the wire W1. Conversely, if the total branch-by-branch load capacitance Cw2 is larger than the total branch-by-branch load capacitance Cw1 by a value larger than the predetermined value, a dummy buffer is inserted at a predetermined point on the wire W2. Otherwise (that is, if the difference between the total branch-by-branch load capacitances Cw1 and Cw2 is smaller than the predetermined value), no dummy buffer is inserted on the wire W1 or W2. If a wire branches in three directions, the design tool subjects three wires to processes of calculating total branch-by-branch load capacitances and comparing the calculation results.

A specific example of the virtual load insertion process S122 to be performed on the layout results illustrated in FIG. 10 is described below. A wire 49 illustrated in FIG. 10 has four branching points a through d. Also, wires Na1 and Na2 are located subsequently to the branching point a, and wires Nb1 and Nb2 are located subsequently to the branching point b. In the total branch-by-branch load capacitance calculation process S184, as for the branching point a, for example, a total value of wire capacitances from the branching point a to the next cells 42 through 45 and input pin capacitances of the next cells 42 through 45 is calculated as a total branch-by-branch load capacitance CNa1 for the wire Na1. Also, as a total branch-by-branch load capacitance CNa2 for the wire Na2 with regard to the branching point a, a total value of a wire capacitance from the branching point a to the next cell 41 and an input pin capacitance of the next cell 41 is calculated. As for the branching point b, a total value of wire capacitances from the branching point b to the next cells 44 and 45 and input pin capacitances of the next cells 44 and 45 is calculated as a total branch-by-branch load capacitance CNb1 for the wire Nb1. Also, as a total branch-by-branch load capacitance CNb2 for the wire Nb2 of the branching point b, a total value of wire capacitances from the branching point b to the next cells 42 and 43 and input pin capacitances of the next cells 42 and 43 is calculated.

In the layout results illustrated in FIG. 10, the total branch-by-branch load capacitance CNa1 for the wire Na1 is considerably larger than the total branch-by-branch load capacitance CNa2 for the wire Na2. Therefore, if a dummy buffer is inserted at a predetermined point on the wire Na1, there is a high possibility that the delay amount of the route having timing constraints tighter than a predetermined degree is changed by an amount larger than a predetermined amount. Therefore, inserting a dummy buffer can be expected to be effective. On the other hand, the total branch-by-branch load capacitance CNb1 for the wire Nb1 is approximately equal to the total branch-by-branch load capacitance CNb2 for the wire Nb2. Therefore, if a dummy buffer is inserted at a predetermined point on the wire Nb1 or Nb2, there is a low possibility that the delay amount of the route having timing constraints tighter than the predetermined degree is changed by an amount larger than the predetermined amount. Therefore, inserting a dummy buffer cannot be expected to be effective.

In the conditional virtual load capacitance insertion process S185, if the total branch-by-branch load capacitances Cw1 and Cw2 for the wires subsequent to the branching point are unbalanced to a degree higher than the predetermined degree (for example, as is the case for the branching point a illustrated in FIG. 10), a dummy buffer is inserted at a predetermined point on the wire whose total branch-by-branch load capacitance is larger than that of the other (in this example, the wire Na1). If these capacitances are not unbalanced to the degree higher than the predetermined degree (for example, as is the case for the branching point b illustrated in FIG. 10), no dummy buffer is inserted. With this, in the conditional virtual load insertion process S185, the point at which a dummy buffer is inserted is limited to a point which allows the power consumption of the circuit to be effectively reduced. By performing the conditional virtual load insertion process S185, the processing time in the delay amount calculation process S130 is reduced for the same reason as that of the second embodiment.

As described above, according to the design method of the present embodiment, by limiting the point at which a dummy buffer is inserted, the number of times of calculating the delay amount of each route is reduced, thereby reducing the processing time required for the entire design method.

(Fourth Embodiment)

Figure 12:
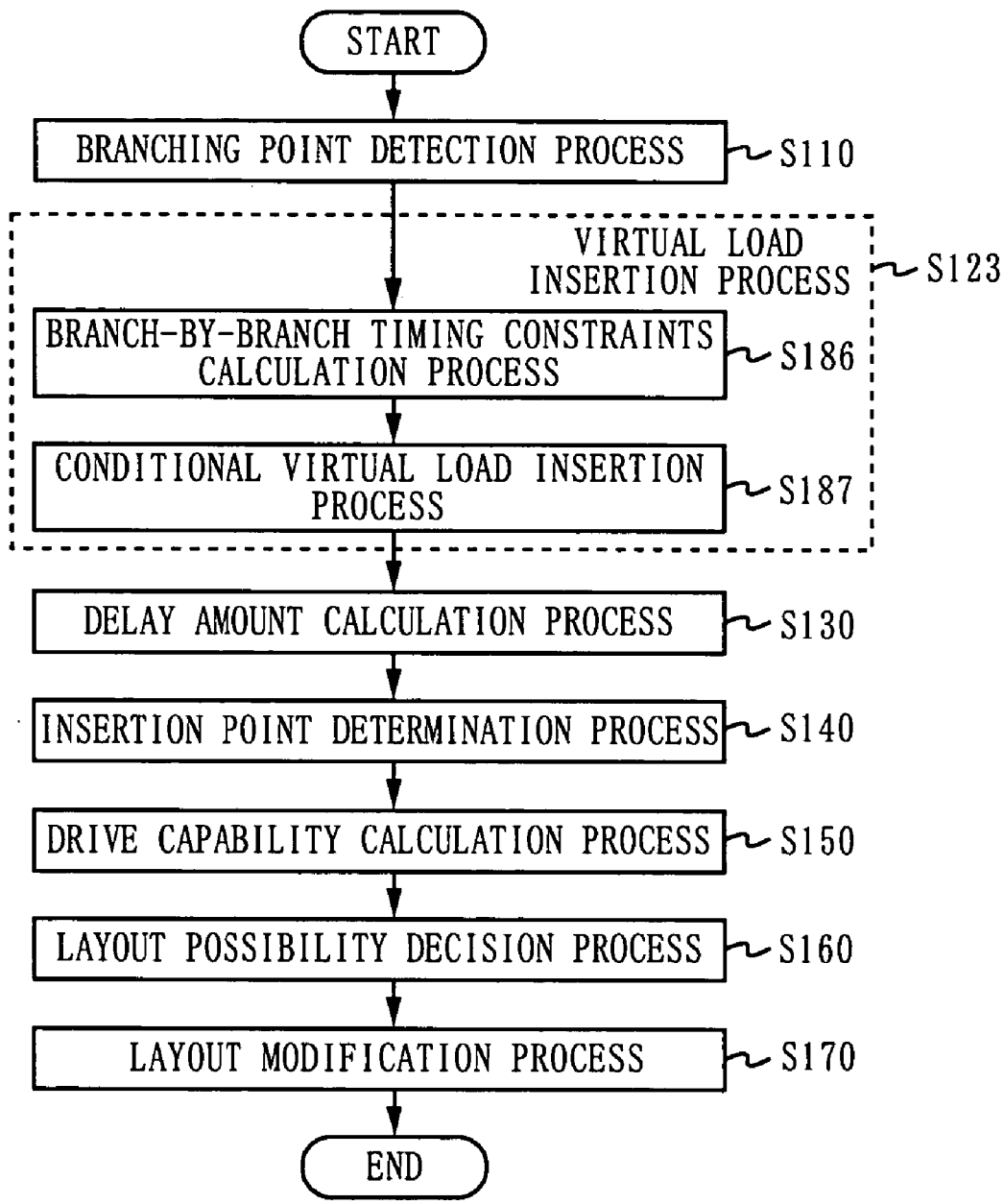
FIG. 12 is a process chart of a design method according to a fourth embodiment of the present invention.

With reference to FIGS. 10 and 12, a fourth embodiment of the present invention is described below. FIG. 12 is a process chart of a design method according to the fourth embodiment of the present invention. The present design method is obtained by replacing the virtual load insertion process S120 included in the design method according to the first embodiment (FIG. 1) by a virtual load insertion process S123 that is different from the process S120. Of the processes illustrated in FIG. 12, processes identical to those illustrated in FIG. 1 are provided with the same reference numerals and are not described herein.

As with the virtual load insertion processes S121 and S122 according to the second and third embodiments, in the virtual load insertion process S123, the design tool determines in accordance with predetermined criteria whether a dummy buffer is required and, upon determination that a dummy buffer is required, then inserts a dummy buffer at a predetermined point on a wire subsequent to the branching point detected in the branching point detection process S110. The virtual load insertion process S123 according to the present embodiment includes a branch-by-branch timing constraints calculation process S186 and a conditional virtual load insertion process S187. In the branch-by-branch timing constraints calculation process S186, the design tool calculates, for each wire subsequent to the branching point detected in the branching point detection process S110, a worst value of timing constraints on routes including that wire (hereinafter referred to as a worst value of branch-by-branch timing constraints). In more detail, as for a branching point at which a wire branches in two directions to be wires W1 and W2, the design tool calculates a worst value of timing constraints on a route from the branching point to the next cell subsequent to the branching point via the wire W1, as a worst value Tw1 of branch-by-branch timing constraints for the wire W1, which is one of the wires subsequent to the branching point. Similarly, the design tool calculates a worst value Tw2 of branch-by-branch timing constraints for the wire W2, which is the other of the wires subsequent to the branching point.

Next, in the conditional virtual load insertion process S187, the design tool compares the worst value Tw1 of branch-by-branch timing constraints for the wire W1 and the worst value Tw2 thereof for the wire W2. If these worst values are unbalanced to a degree higher than a predetermined degree, the design tool inserts a dummy buffer at a predetermined point on a wire whose branch-by-branch timing constraints are tighter. That is, if the worst value Tw1 of branch-by-branch timing constraints indicates timing constraints tighter than those of the worst value Tw2 by a degree higher than a predetermined degree, a dummy buffer is inserted at a predetermined point on the wire W1. Conversely, if the worst value Tw2 of branch-by-branch timing constraints indicates timing constraints tighter than those of the worst value Tw1 by the degree higher than the predetermined degree, a dummy buffer is inserted at a predetermined point on the wire W2. Otherwise (that is, if the difference between the worst values Tw1 and Tw2 of branch-by-branch timing constraints is smaller than a predetermined value), no dummy buffer is inserted on the wire W1 or W2. If a wire branches in three directions, the design tool subjects three wires to processes of calculating worst values of branch-by-branch timing constraints and comparing the calculation results.

A specific example of the virtual load insertion process S123 to be performed on the layout results illustrated in FIG. 10 is described below. The wire 49 illustrated in FIG. 10 has four branching points a through d, and the wires Nb1 and Nb2 are located subsequently to the branching point b. In the branch-by-branch timing constraints calculation process S186, as for the branching point b, for example, the following processes are performed. That is, firstly, timing constraints T42 through T45 are calculated for routes from the branching point b to the next cells 42 through 45. Then, of the timing constraints T44 and T45, timing constraints that are tighter are selected as having a worst value TNb1 of branch-by-branch timing constraints for the wire Nb1, which is one of the wires subsequent to the branching point b. Similarly, of the timing constraints T42 and T43, timing constraints that are tighter are selected as having a worst value TNb2 of branch-by-branch timing constraints for the wire Nb2, which is the other of the wires subsequent to the branching point b.

Consider a case where the above-calculated worst value TNb1 of branch-by-branch timing constraints for the wire Nb1 is larger than the above-calculated worst value TNb2 thereof for the wire Nb2 by a value larger than a predetermined value. In this case, if a dummy buffer is inserted at a predetermined point on the wire Nb1, there is a high possibility that the delay amount of the route having timing constraints tighter than the predetermined degree is changed by an amount larger than a predetermined value. Therefore, inserting a dummy buffer can be expected to be effective. On the other hand, consider another case where the worst value TNb2 of branch-by-branch timing constraints for the wire Nb2 is larger than the above-calculated worst value TNb1 thereof for the wire Nb1 by a value larger than the predetermined value. In this case, if a dummy buffer is inserted at a predetermined point on the wire Nb2, there is a high possibility that the delay amount of the route having timing constraints tighter than the predetermined degree is changed by an amount larger than the predetermined amount. Therefore, inserting a dummy buffer can be expected to be effective. Otherwise (that is, if the difference between the worst values TNb1 and TNb2 of branch-by-branch timing constraints is smaller than a predetermined value), there is a low possibility that the delay amount of the route having timing constraints tighter than the predetermined degree is changed by an amount larger than the predetermined amount. Therefore, inserting a dummy buffer is not expected to be effective.

In the conditional virtual load insertion process S187, if the worst values TNb1 and TNb2 of branch-by-branch timing constraints regarding the wires subsequent to the branching point are unbalanced to a degree higher than a predetermined degree, a dummy buffer is inserted at a predetermined point on a wire whose timing constraints are tighter those of the other wire. If these worst values are not unbalanced to a degree higher than the predetermined degree, no dummy buffer is inserted. With this, in the conditional virtual load insertion process S187, the point at which a dummy buffer is inserted is limited to a point which allows the power consumption of the circuit to be effectively reduced. By performing the conditional virtual load insertion process S187, the processing time in the delay amount calculation process S130 is reduced for the same reason as that of the second and third embodiments.

As described above, according to the design method of the present embodiment, by limiting the point at which a dummy buffer is inserted, the number of times of calculating the delay amount of each route is reduced, thereby reducing the processing time required for the entire design method.

(Exemplary Modification of Second Through Fourth Embodiments)

In the second through fourth embodiments, three exemplary methods for reducing the processing time of the low-power design method have been described. Of these three processing time reduction methods, two or three can be arbitrarily combined.

Figure 13:
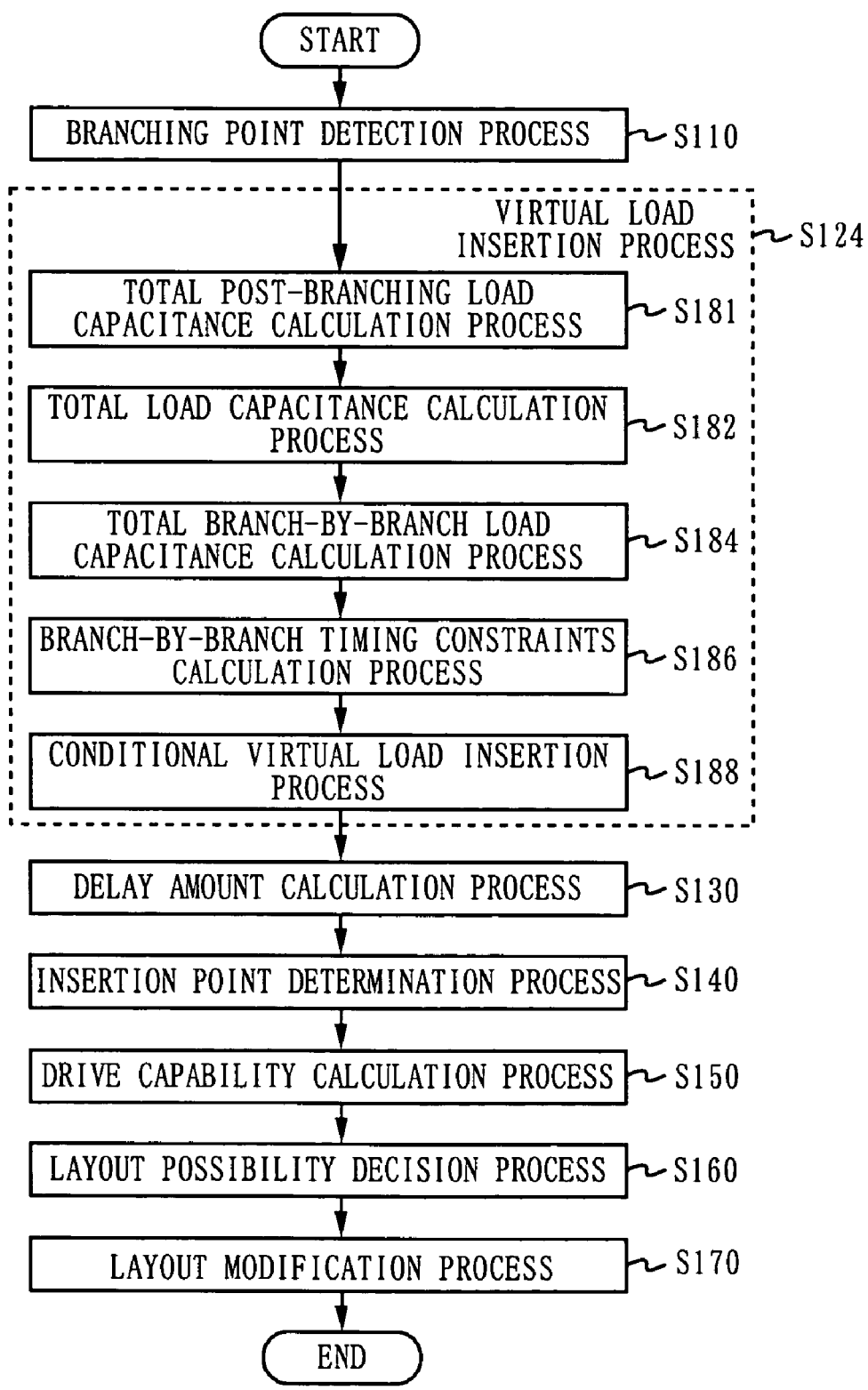
FIG. 13 is a process chart of a design method according to an exemplary modification of the second through fourth embodiments of the present invention.

FIG. 13 is a process chart of a design method according to an exemplary modification of the second through fourth embodiments of the present invention. Of the processes illustrated in FIG. 13, processes identical to those illustrated in FIGS. 1, 9, 11, and 12 are provided with the same reference numerals and are not described herein.

As with the virtual load insertion processes S121 through S123, in the virtual load insertion process S124, the design tool determines in accordance with predetermined criteria whether a dummy buffer is required and, upon determination that a dummy buffer is required, inserts a dummy buffer at a predetermined point on a wire subsequent to the branching point detected in the branching point detection process S110. The virtual load insertion process S124 illustrated in FIG. 13 includes a total post-branching load capacitance calculation process S181, a total load capacitance calculation process S182, a total branch-by-branch load capacitance calculation process S184, a branch-by-branch timing constraints calculation process S186, and a conditional virtual load insertion process S188.

Figure 14:
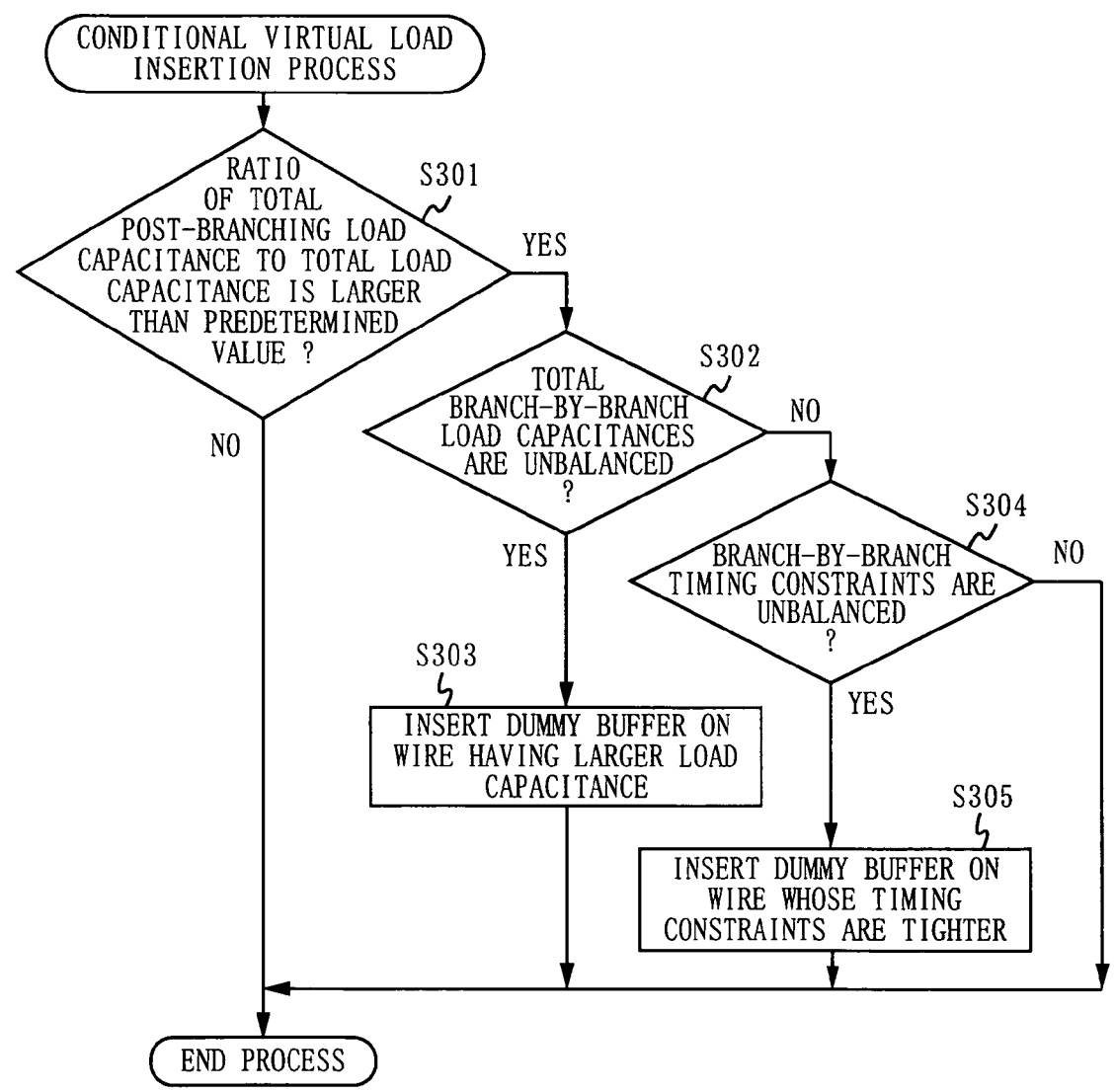
FIG. 14 is a flowchart showing details of a conditional virtual load insertion process in the design method illustrated in FIG. 13.

FIG. 14 is a flowchart showing details of the conditional virtual load insertion process S188. The process illustrated in FIG. 14 is performed on each branching point detected in the branching point detection process S110. The process illustrated in FIG. 14 is performed by referring to the total post-branching load capacitance Cpart calculated in the total post-branching load capacitance calculation process S181, the total load capacitance Call calculated in the total load capacitance calculation process S182, the total branch-by-branch load capacitances Cw1 and Cw2 calculated in the total branch-by-branch load capacitance calculation process S184, and the worst values Tw1 and Tw2 of branch-by-branch timing constraints calculated in the branch-by-branch timing constraints calculation process S186.

In the conditional virtual load insertion process S188, the design tool performs the following processes. The design tool first determines whether a ratio of the total post-branching load capacitance Cpart to the total load capacitance Call is larger than a predetermined value (step S301). If the ratio is larger than the predetermined value, the design tool goes to step S302. In this case, the design tool then determines whether the total branch-by-branch load capacitances Cw1 and Cw2 are unbalanced to a degree higher than a predetermined degree (step S302). If these total branch-by-branch load capacitances Cw1 and Cw2 are unbalanced to the degree higher than the predetermined degree, the design tool inserts a dummy buffer at a predetermined point on a wire whose total branch-by-branch load capacitance is larger than that of the other wire (step S303).

On the other hand, if these total branch-by-branch load capacitances Cw1 and Cw2 are not unbalanced to the degree higher than the predetermined degree, the design tool determines whether the worst values Tw1 and Tw2 of the branch-by-branch timing constraints are unbalanced to the degree higher than the predetermined degree (step S304). If these total branch-by-branch load capacitances Cw1 and Cw2 are unbalanced to the degree higher than the predetermined degree, the design tool inserts a dummy buffer at a predetermined point on a wire whose branch-by-branch timing constraints are tighter than those of the other wire (step S305).

If No is determined in step S301 or No is determined in both of steps S302 and S303, the design tool ends the conditional virtual load insertion process S188 without inserting a dummy buffer.

As described above, by arbitrarily combining the methods for reducing the processing time of the low-power design method so as to limit the point at which a dummy buffer is inserted, the number of times of calculating the delay amount of each route with the dummy buffer being inserted is reduced, thereby reducing the processing time required for the entire design method.

(Fifth Embodiment)

Figure 15:
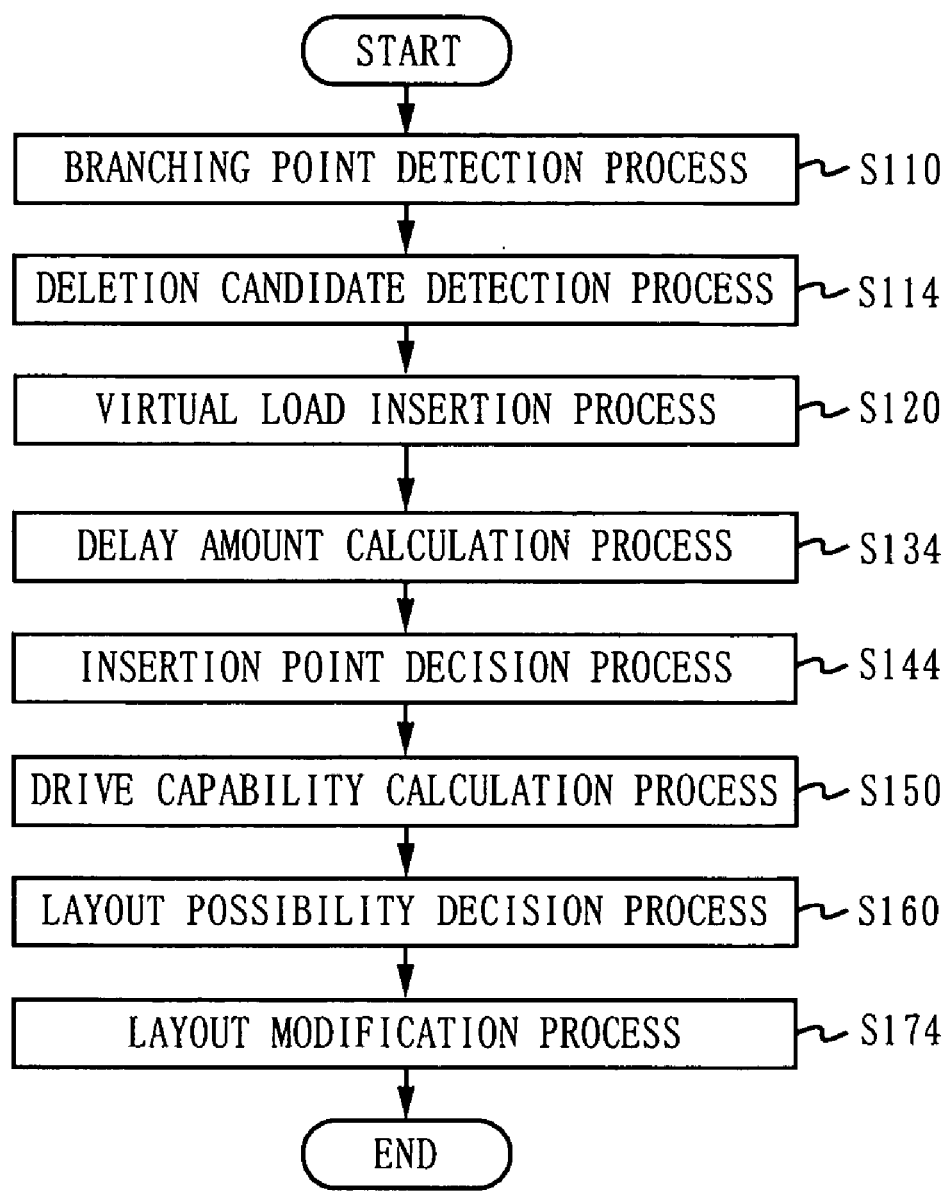
FIG. 15 is a process chart of a design method according to a fifth embodiment of the present invention.

With reference to FIGS. 15 through 18, a fifth embodiment of the present invention is described below. FIG. 15 is a process chart of a design method according to the present embodiment. The present design method includes the branching point detection process S110, a deletion candidate detection process S114, the virtual load insertion process S120, a delay amount calculation process S134, the insertion point determination process S140, the drive capability calculation process S150, the layout possibility decision process S160, and a layout changing process S174. Of the processes illustrated in FIG. 15, processes identical to those illustrated in FIG. 1 are provided with the same reference numerals and are not described herein.

In the deletion candidate detection process S114, the design tool detects, in the layout results to be processed, a buffer which has no influence on the logic function of the circuit and whose output terminal is connected to a wire having a branching point(s) thereon (such a buffer is hereinafter referred to as a deletable buffer). A large number of such deletable buffers are often included in a circuit designed by a top-down design methodology.

In the delay amount calculation process S134, as with the delay amount calculation process S130 according to the first through fourth embodiments, the design tool calculates a plurality of delay amounts with a dummy buffer being virtually inserted in the virtual load insertion process 120 and a delay amount without a dummy buffer being inserted. In addition, in the delay amount calculation process S134, the design tool calculates a delay amount of a route connecting a cell preceding the deletable buffer detected in the deletion candidate detection process S114 and a cell immediately subsequent to the deletable buffer in a case where the deletable buffer is virtually deleted.

In the insertion point determination process S144, as with the insertion point determination process S140 according to the first through fourth embodiments, the design tool determines a point at which a load-dividing buffer should be inserted on the wire based on the delay amounts calculated in the delay amount calculation process S134. Note that, in the insertion point determination process S144 according to the present embodiment, the insertion point of the load-dividing buffer is determined also in consideration of the delay amount of the route with the deletable buffer being virtually deleted. With this, a deletable buffer to be actually deleted is specified.

In the layout modification process S174, as with the layout modification process S170 according to the first through fourth embodiments, the design tool performs a layout modification process on the layout results to be processed with regard to the insertion point determined in the layout possibility decision process S160 at which a load-dividing buffer is allowed to be inserted. In the layout modification process S174 according to the present embodiment, the design tool also performs, on the layout results to be processed, a process of deleting the deletable buffer determined in the insertion point determination process S144 as actually requiring deletion.

Figure 16:
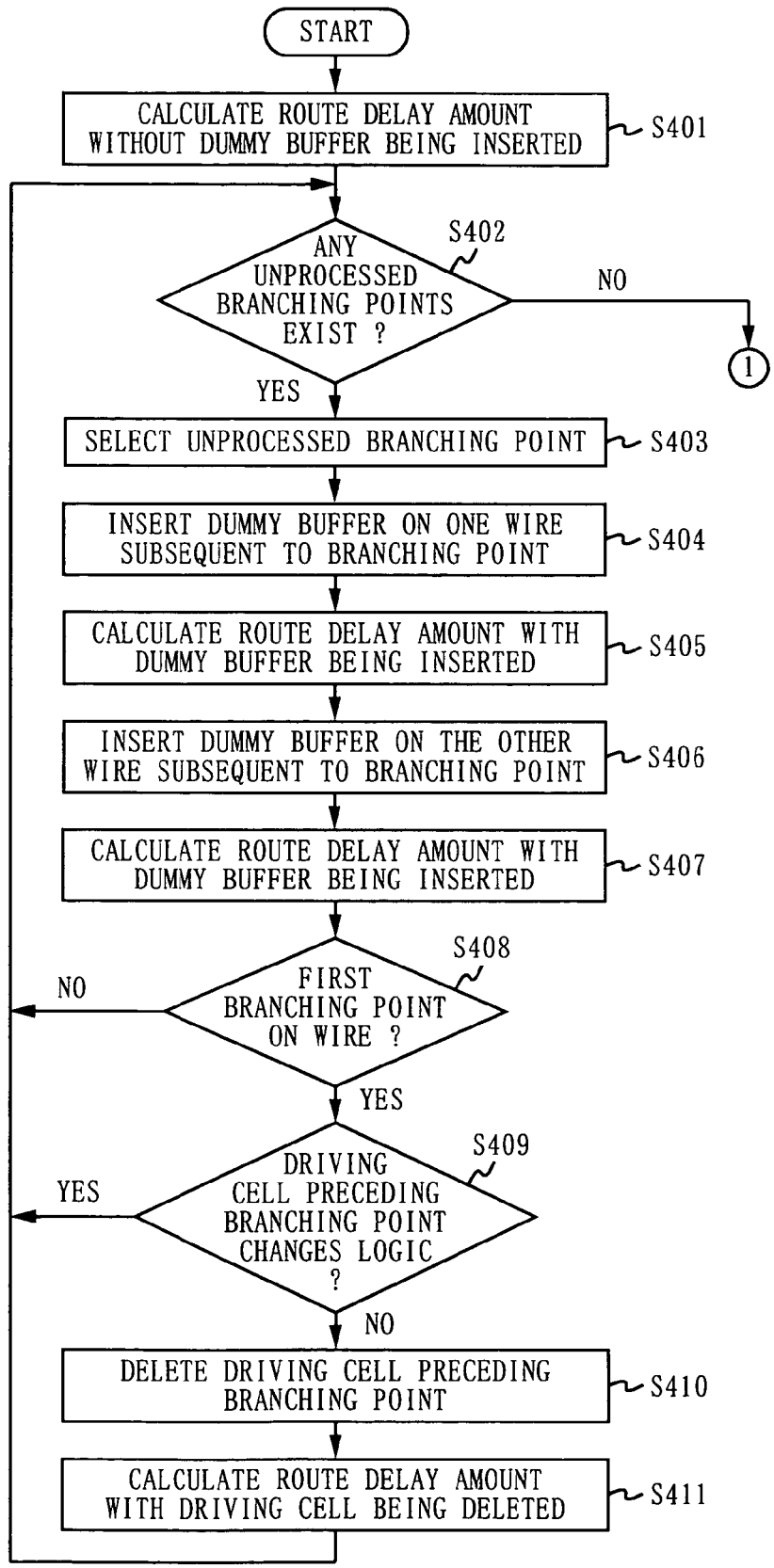
FIG. 16 is a flowchart showing details of a first half of the processes in the design method according to the fifth embodiment of the present invention.

FIG. 16 illustrates, in a flowchart format, processes from the branching detection process S111 through the delay amount calculation process S134 illustrated in FIG. 15. In comparison between FIGS. 15 and 16, the branching point detection process S110 corresponds to steps S402 and S403, the deletion candidate detection process S114 corresponds to steps S409 through S411, the virtual load insertion procession S120 corresponds to steps S404 and S406, and the delay amount calculation process S134 corresponds to steps S401, S405, and S407.

Steps S401 through S407 illustrated in FIG. 16 are identical to steps S201 through S207 illustrated in FIG. 2, and therefore are not described herein. After step S407, the design tool performs the following processes. The design tool first determines whether the branching point selected in step S402 is the first branching point on the wire (step S408), and then determines whether the driving cell preceding the branching point changes the logic of the circuit (step S409). If Yes is determined in step S408 and No is determined in step S409, the design tool deletes the driving cell preceding the branching point (step S410), calculates the delay amount of the route with the driving cell being deleted (step S411), and then goes to step S402. If No is determined in step S408 or Yes is determined in step S409, the design tool directly goes to step S402 without performing steps S410 and S411.

A specific example of the design method according to the present embodiment to be performed on layout results illustrated in FIG. 17A is described below. FIG. 17A illustrates, as the layout results, a driving cell 50, five next cells 51 through 55, a previous cell 56 preceding the driving cell 50, a cell 57 connected to the previous cell 56, and a wire 59. The wire 59 has four branching points a through d connecting the output terminal of the driving cell 50 and the input terminals of the next cells 51 through 55. The driving cell 50 has no influence on the logic function of the circuit. Of five routes from the driving cell 50 to the next cells 51 through 55, it is assumed that the route from the driving cell 50 to the next cell 54 (indicated by a bold line) has tightest timing constraints.

When the layout results illustrated in FIG. 17A are to be processed, in the branching point detection process S110, the four branching points a through d are detected in the wire 59. Also, the driving cell 50 has no influence on the logic function of the circuit, and its output terminal is connected to the wire 59 having these branching points. Therefore, in the deletion candidate detection process S114, the driving cell 50 is detected as a deletable buffer. In the delay amount calculation process S134, route delay amounts with a dummy buffer being virtually inserted on the wires subsequent to the branching points a through d, route delay amounts without a dummy buffer being virtually inserted, and also route delay amounts with the driving cell 50 being virtually deleted are calculated.

In the insertion point determination process S144, based on the delay amounts calculated in the delay amount calculation process S134, an insertion point at which a load-dividing buffer is to be inserted and a deletable buffer to be actually deleted are determined. In the following, by way of example only, it is assumed that determination is made such that a load-dividing buffer is inserted at an insertion point R illustrated in FIG. 17A and the driving cell 50 is to be deleted. In this case, in the layout modification process S174, a load-dividing buffer 58 is placed at the insertion point R, the driving cell 50 is deleted, and then wiring information regarding the wires connected to the load-dividing buffer 58 and the driving cell 50 is changed. As a result, the layout results illustrated in FIG. 17A are changed to those as illustrated in FIG. 17B.

As described above, according to the design method of the present embodiment, in a case where a driving cell drives a plurality of next cells and, although a route having tight timing constraints is short, the driving cell is required to have a high drive capability due to a large total value of the wire capacitances and the input pin capacitances of the next cells, a load-dividing buffer for driving the next cell having not so tight timing constraints is newly inserted. Also, the driving cell is deleted so that the previous cell preceding the driving cell and having tight timing constraints is driven. With this, the power consumption of the circuit can be reduced.

Figures 18A, 18B:
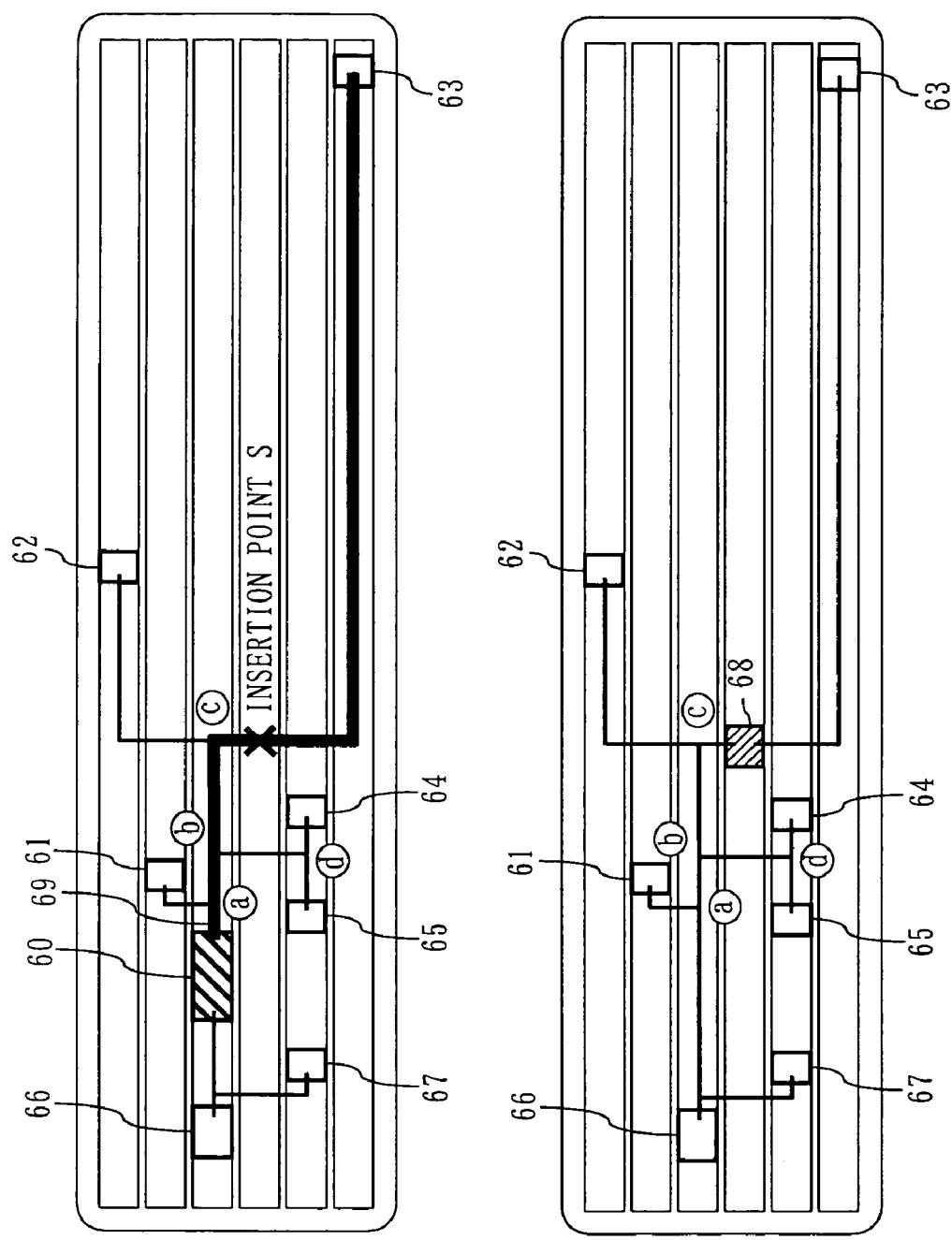
FIGS. 18A and 18B are illustrations showing other layout results for describing the processes in the design method according to the fifth embodiment of the present invention.
Figure 19:
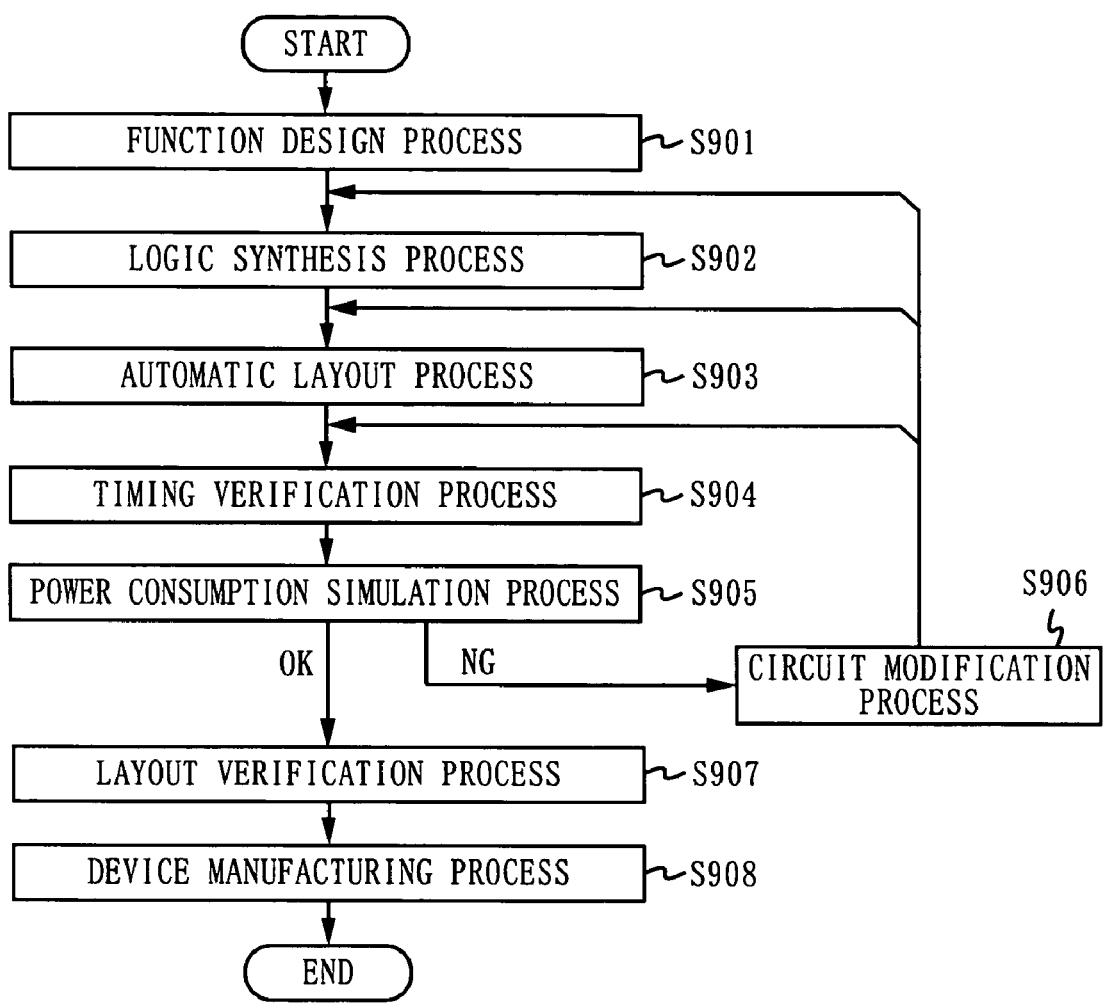
FIG. 19 is a process chart of a conventional scheme for designing a low-power semiconductor integrated circuit.

Another specific example of the processes in the design method according to the present embodiment to be performed on the layout results illustrated in FIG. 18A is described below. The arrangement of the cells and wiring among the cells in FIG. 18A are identical to those illustrated in FIG. 17A. A driving cell 60 is a cell that has no influence on the logic function of the circuit. It is assumed that, of five routes from the driving cell 60 to next cells 61 through 65, the route from the driving cell 30 to the next cell 63 (indicated by a bold line) is a route having tightest timing constraints.

It is also assumed that it is determined in the insertion point determination process S144 that a load-dividing buffer is inserted at an insertion point S illustrated in FIG. 18A and the driving cell 60 is to be deleted. In this case, in the layout modification process S174, a load-dividing buffer 68 is inserted at the insertion point S, the driving cell 60 is deleted, and then wiring information regarding the wires connected to the load-dividing buffer 68 and the driving cell 60 is changed. As a result, the layout results illustrated in FIG. 18A are changed to those as illustrated in FIG. 18B.

As described above, according to the design method of the present embodiment, in a case where the driving cell drives a small number of next cells having tight timing constraints and a large number of next cells having not so tight timing constraints and the driving cell is required to have a high drive capability due to a large total value of the wire capacitance and the input pin capacitances of other next cells, a load-dividing buffer is newly inserted on a route having tight timing constraints so as to selectively perform high-speed driving only at a portion around that route. Furthermore, the driving cell is deleted in order to drive the cell preceding the driving cell and having not so tight timing constraints. Thus, the power consumption of the circuit can be reduced.

An effect of the present embodiment is described below. According to the design method of the above-described first embodiment, a load-dividing buffer is inserted at a predetermined point on the wire subsequent to the branching point, and also the drive capability of the driving cell is reduced. With this, the power consumption of the circuit can be reduced. The design method according to the present embodiment is achieved by providing the method according to the first embodiment with a process of detecting a deletable buffer in the layout results to be processed and a process of deleting the detected deletable buffer from the layout results. The process of adding a load-dividing buffer and the process of deleting the deletable buffer are equivalent to a buffer moving process. Therefore, according to the design method of the present embodiment, reduction in the power consumption of the circuit can be achieved not only by the buffer adding process but also the buffer moving process. Therefore, the effect of reduction of the power consumption can be further increased.

(Exemplary Modifications of the First Through Fifth Embodiments)

As for the design methods according to the first through fifth embodiments, various exemplary modifications can be devised. By way of example, in the branching point detection process, all branching points included in the layout results to be processed may be detected, or a predetermined number of branching points may be detected. Furthermore, in the delay amount calculation process, an arbitrary scheme of calculating the delay amount may be used. Still further, the method of reducing the processing time by limiting the dummy buffer insertion point described in the second through fourth embodiments may be applied to the design method according to the fifth embodiment.

Still further, the processes as far as the delay amount calculation process in the design method according to each of the above embodiments may be performed as a delay information calculation method. Specifically, in the design method according to each of the first through fourth embodiments, the branching point detection process S110, the virtual load insertion processes S120 through S124, and the delay amount calculation process S130 can be performed as a method of calculating delay information in a case where load division is performed on a semiconductor integrated circuit. Still further, in the design method according to the fifth embodiment, the branching point detection process S110, the deletion candidate detection process S114, the virtual load insertion process S120, and the delay amount calculation process S134 can be performed as a delay information calculation method.

According to the delay information calculation method, delay information in a case where a dummy buffer is inserted on a wire subsequent to the branching point can be obtained. With the obtained delay information being presented to the designer in an appropriate manner, the designer can easily recognize the situation with regard to load distribution in the circuit. Also, the designer can recognize the situation with regard to changes in delay amount of the routes in accordance with insertion of a dummy buffer, and can detect a design margin included in the layout results of the circuit.

While the invention has been described in detail, the foregoing description is in all aspects illustrative and not restrictive. It is understood that numerous other modifications and variations can be devised without departing from the scope of the invention.

What is claimed is:

1. A design method for changing layout results of a semiconductor integrated circuit, the method comprising the steps of:
   detecting a branching point of a wire in the layout results including information regarding types of cells, information regarding arrangement of the cells, and information regarding wiring among the cells;
   virtually inserting a load having a predetermined amount at a predetermined point on one of wires subsequent to the detected branching point;
   calculating a delay amount of each route connecting cells via the branching point with the load being inserted and a delay amount thereof without the load being inserted;
   determining, based on the delay amounts of each route, an insertion point at which a load-dividing buffer is to be inserted;
   calculating a drive capability of a driving cell preceding the insertion point, on condition that the load-dividing buffer is to be inserted at the determined insertion point and based on timing-constraints of each route;
   deciding, based on the layout results, whether the load-dividing buffer is insertable at the insertion point; and
   performing a process of changing the layout results based on the decision results, the process including a process of placing the load-dividing buffer at the insertion point, a process of changing the driving cell to a cell having the calculated drive capability, and a process of changing wiring information in accordance with circuit changes.

2. The semiconductor integrated circuit design method according to claim 1, wherein when a delay amount of a route determined under predetermined decision criteria as having tight timing constraints is changed by an amount larger than a predetermined amount with the load being virtually inserted at the predetermined point, the insertion point determining step determines the predetermined point as the insertion point at which the load-dividing buffer is to be inserted.

3. The semiconductor integrated circuit design method according to claim 2, wherein of routes connecting cells via the branching point, the insertion point determining step determines a route having tightest timing constraints as having tight timing constraints.

4. The semiconductor integrated circuit design method according to claim 1, wherein the load inserting step virtually inserts the load at the predetermined point on the wire subsequent to the detected branching point when it is determined in accordance with predetermined criteria that the load is required.

5. The semiconductor integrated circuit design method according to claim 4, wherein the load inserting step includes the steps of:
   calculating a total load capacitance after the branching point; calculating a total load capacitance of the driving cell; and
   virtually inserting the load at the predetermined point on the wire subsequent to the branching point when a ratio of the total load capacitance after the branching point to the total load capacitance of the driving cell is larger than a predetermined value.

6. The semiconductor integrated circuit design method according to claim 4, wherein the load inserting step includes the steps of:
   calculating, for each of the wires subsequent to the branching point, a total load capacitance after one of the wires; and
   virtually inserting the load at the predetermined point on the wire so that the total load capacitance after the wire is largest of all total load capacitances for the wires subsequent to the branching point, in a case where the total load capacitances are unbalanced to a degree higher than a predetermined degree.

7. The semiconductor integrated circuit design method according to claim 4, wherein the load inserting step includes the steps of:
- calculating, for each of the wires subsequent to the branching point, a worst value of timing constraints of a route including one of the wires; and
- virtually inserting the load at a predetermined point on a wire whose worst value of timing constraints indicates timing constraints tightest of all the calculated worst values of timing constraints, in a case where the worst values of timing constraints for the wires subsequent to the branching point are unbalanced to a degree higher than a predetermined degree.

8. The semiconductor integrated circuit design method according to claim 4, further comprising:
- prior to the route delay amount calculating step, a step of detecting, in the layout results, a deletable buffer which has no influence on a logic function of the circuit and is connected at an output terminal to the wire having the branching point, wherein
- the route delay amount calculating step further calculates a delay amount of a route connecting a cell preceding the deletable buffer and a cell immediately subsequent to the deletable buffer with the deletable buffer being virtually deleted, and
- the layout results changing step further performs a process of deleting the deletable buffer from the layout results.

9. A method of obtaining delay information regarding delays occurring when load division is performed based on layout results of a semiconductor integrated circuit, the method comprising the steps of:
- detecting a branching point on a wire in the layout results including information types of cells, information regarding arrangement of the cells, and information regarding wiring among the cells;
- virtually inserting a load having a predetermined amount at a predetermined point on a wire subsequent to the detected branching point;
- calculating a delay amount of a route connecting cells via the branching point with the load being inserted and a delay amount thereof without the load being inserted; and
- prior to the route delay amount calculating step, a step of detecting, in the layout results, a deletable buffer which has no influence on a logic function of the circuit and is connected at an output terminal to the wire having the branching point, wherein
- the route delay amount calculating step further calculates a delay amount of a route connecting a cell preceding the deletable buffer and a cell immediately subsequent to the deletable buffer with the deletable buffer being virtually deleted.

* * * * *